(12) United States Patent
Kang

(10) Patent No.: US 7,786,600 B2
(45) Date of Patent: Aug. 31, 2010

(54) CIRCUIT SUBSTRATE HAVING CIRCUIT WIRE FORMED OF CONDUCTIVE POLARIZATION PARTICLES, METHOD OF MANUFACTURING THE CIRCUIT SUBSTRATE AND SEMICONDUCTOR PACKAGE HAVING THE CIRCUIT WIRE

(75) Inventor: Tae Min Kang, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 91 days.

(21) Appl. No.: 12/207,124

(22) Filed: Sep. 9, 2008

(65) Prior Publication Data

US 2009/0321953 A1    Dec. 31, 2009

(30) Foreign Application Priority Data

Jun. 30, 2008    (KR) .............. 10-2008-0062909
Jun. 30, 2008    (KR) .............. 10-2008-0062915

(51) Int. Cl.
*H01L 23/52* (2006.01)
*H01L 23/48* (2006.01)
*H01L 23/485* (2006.01)
*H01L 21/50* (2006.01)
*H01L 21/48* (2006.01)
*H01L 21/44* (2006.01)

(52) U.S. Cl. ............. 257/780; 257/E23.021; 438/119

(58) Field of Classification Search ........ 257/780, 257/E23.021; 438/119
See application file for complete search history.

(56) References Cited

U.S. PATENT DOCUMENTS

| | | | |
|---|---|---|---|
| 6,538,801 B2 * | 3/2003 | Jacobson et al. | 359/296 |
| 6,690,564 B1 * | 2/2004 | Haruta et al. | 361/212 |
| 6,720,787 B2 * | 4/2004 | Kimura et al. | 324/765 |
| 7,157,800 B2 * | 1/2007 | Sano et al. | 257/783 |
| 7,342,556 B2 * | 3/2008 | Oue et al. | 345/33 |
| 7,393,471 B2 * | 7/2008 | Inoue et al. | 252/500 |
| 7,528,485 B2 * | 5/2009 | Morita et al. | 257/735 |

FOREIGN PATENT DOCUMENTS

| | | |
|---|---|---|
| KR | 1020020026995 A | 4/2002 |
| KR | 10-0676039 B1 | 1/2007 |
| KR | 1020070032627 A | 3/2007 |

\* cited by examiner

*Primary Examiner*—Kiesha R Bryant
(74) *Attorney, Agent, or Firm*—Ladas & Parry LLP

(57) ABSTRACT

A circuit substrate includes a substrate body having a first terminal and a second terminal separated from the first terminal. A circuit wire includes a wiring unit for electrically connecting the first and second terminals by electrically connecting conductive polarization particles that include a first polarity and a second polarity that is opposite to the first polarity. The circuit wire also includes an insulation unit for insulating the wiring unit.

43 Claims, 14 Drawing Sheets

CIRCUIT SUBSTRATE HAVING CIRCUIT WIRE FORMED OF CONDUCTIVE POLARIZATION PARTICLES, METHOD OF MANUFACTURING THE CIRCUIT SUBSTRATE AND SEMICONDUCTOR PACKAGE HAVING THE CIRCUIT WIRE

CROSS-REFERENCE TO RELATED APPLICATIONS

The present application claims priority to Korean patent application numbers 10-2008-0062909 filed on Jun. 30, 2008 and 10-2008-0062915 filed on Jun. 30, 2008, which are incorporated herein by reference in their entireties.

BACKGROUND OF THE INVENTION

The present invention relates generally to a circuit substrate having a circuit wire, a method of manufacturing the circuit substrate and a semiconductor package having the circuit wire, and more particularly to a circuit substrate having a circuit wire formed of conductive polarization particles.

Recently, a variety of electronic appliances and products have been developed that utilize technical developments in electrical and electronic industries. Most of these electronic appliances and products include circuit substrates, which are used to mount electric devices, electronic devices, and semiconductor packages thereon.

The circuit substrate includes circuit wires for electrically connecting electric devices, electronic devices, and semiconductor packages.

The conventional circuit wires are formed by patterning a metal layer formed on an insulation substrate. However, when the circuits formed on the insulation substrate intersect each other on the same plane, a short occurs between the circuits. The circuit substrate generally includes electrically insulated multi-layer circuit patterns.

However, forming these multi-layer circuit patterns on the circuit substrate requires a complex process, and furthermore, detecting faulty wires is very difficult, even when the faulty wire is generated during the manufacturing process.

Particularly, a recently developed wafer level includes circuit wires which are formed directly on the semiconductor chip. However, since the area of a wafer level package is very small, it is difficult to form multi-layer circuit wires.

SUMMARY OF THE INVENTION

Embodiments of the present invention are include a circuit substrate having a circuit wire that is manufactured using a simple manufacturing process, allowing for fault detection during the manufacturing process, and which can intersect another wire on the same plane.

Also, embodiments of the present invention include a method of manufacturing the circuit substrate.

Further, embodiments of the present invention include a semiconductor package including the circuit wire.

In one embodiment, a circuit substrate comprises a substrate body having a first terminal and a second terminal spaced apart from the first terminal; and a circuit wire including a wiring unit for electrically connecting the first and second terminals by electrically connecting conductive polarization particles respectively having a first polarity and a second polarity opposite of the first polarity, and an insulation unit for insulating the wiring unit.

The conductive polarization particles have conductive rheological maternal.

The circuit substrate may further comprise an intersection wire including an intersection wiring unit having a third terminal disposed over the substrate body, a fourth terminal spaced apart from the third terminal along the substrate body and conductive polarization particles for electrically connecting the third and fourth terminals and intersecting the circuit wire over the substrate body, and an intersection insulation unit for insulating the intersection wiring unit.

The circuit substrate may further comprise an additional circuit wire including an additional wiring unit having a metal wire disposed over the substrate body, a third terminal spaced apart from the metal wire and conductive polarization particles for electrically connecting the metal wire and the third terminal, and an additional insulation unit for insulating the additional wiring unit.

The circuit substrate may further comprise a first connection unit extending from the first terminal along the substrate body and a second connection unit extending from the second terminal along the substrate body, wherein the first end of the wiring unit is connected to the first connection unit and a second end opposite of the first end is connected to the second connection unit.

In another embodiment, a method of manufacturing a circuit wire comprises forming a preliminary circuit wire by connecting first and second terminals of the substrate body with wiring material in which the conductive polarization particles have a first polarity and a second polarity that is opposite to the first polarity and a flowable insulator; forming a wiring unit electrically connected with the first and second terminals through application of a first power having the first polarity to the first terminal and a second power having the second polarity to the second terminal, thus electrically connecting the conductive polarization particles within the flowable insulator; and forming an insulation unit for securing and insulating the wiring unit by curing the flowable insulator.

The conductive polarization particles are formed of conductive rheological maternal.

The step of forming the preliminary circuit wire is carried out by one of a printing process, a dispensing process, and a silk screen printing process.

The step of forming the substrate body includes the step of forming a first connection unit extending from the first terminal along the substrate body and a second connection unit extending from the second terminal along the substrate body, wherein the first end of the wiring unit is connected to the first connection unit and a second end opposite of the first end is connected to the second connection unit.

In another embodiment, a semiconductor package comprises a semiconductor chip formed with bonding pads over an upper surface thereof; conductive land patterns spaced apart from the bonding pads; and circuit wires respectively including a wiring unit for electrically connecting the bonding pad and the conductive land pattern corresponding to the bonding pad by electrically connecting conductive polarization particles respectively having a first polarity and a second polarity opposite of the first polarity, and an insulation unit for insulating the wiring unit.

The conductive polarization particles have conductive rheological maternal.

The land pattern may include an anisotropic conductive film.

Alternatively, the land pattern may include a metal plate.

The land pattern includes a connection unit extending along the upper surface, and an end of the circuit wire is electrically connected with the connection unit.

At least two circuit wires of the circuit wires intersect each other.

The semiconductor package may further comprise a solder resist pattern disposed over the upper surface which has openings for exposing the land patterns and connection members respectively connected to the land pattern through the opening.

The connection member includes a conductive ball.

The land patterns are disposed over the semiconductor chip.

The semiconductor package may further comprise a molding member for covering the lower surface and side surfaces connected to the upper surface.

Some of the land patterns are disposed over the semiconductor chip and the remaining land patterns are disposed over the molding member.

The semiconductor package may further comprise a substrate having a connection pad disposed at positions corresponding to the land patterns; and bumps for electrically connecting the connection pad and the land pattern.

The semiconductor package may further comprise a gap filling member filled in a gap formed between the semiconductor chip and the substrate.

In another embodiment, a semiconductor package comprises a substrate having connection pads; a semiconductor chip module including semiconductor chips respectively having pads; and circuit wires respectively including a wiring unit for electrically connecting the pad included in respective semiconductor chips and the connection pad corresponding to the pad by electrically connecting conductive polarization particles respectively having a first polarity and a second polarity opposite of the first polarity, and an insulation unit for covering the wiring unit.

The semiconductor chips are stacked in a stepped shape to expose the pads of the respective semiconductor chips.

The conductive polarization particles have conductive rheological maternal.

The semiconductor package may further comprise guide members disposed at the side surface of the respective semiconductor chips and having an inclined plane with an obtuse angle with respect to the upper surface of the semiconductor chip.

In another embodiment, a semiconductor package comprises a substrate having connection pads; a semiconductor chip module including semiconductor chips respectively having exposed chip selection pads; and circuit wires respectively including a wiring unit for electrically connecting the chip selection pad included in respective semiconductor chips and the connection pad corresponding to the chip selection pad through the conductive polarization particles respectively having a first polarity and a second polarity opposite of the first polarity, and an insulation unit for covering the wiring unit.

The semiconductor chips are stacked in a stepped shape for exposing the chip selection pads formed in the respective semiconductor chips.

The conductive polarization particles have conductive rheological maternal.

The semiconductor package may further comprise guide members disposed at the side surface of respective semiconductor chips and having an inclined plane formed having an obtuse angle with respect to the upper surface of the respective semiconductor chip.

The semiconductor chip further includes data pads, data redistributions respectively electrically connected with the data pad, and data through electrodes respectively passing through the data pad and electrically connected with the data redistribution.

The chip selection pad in different semiconductor chips is electrically connected with one chip selection pad by the circuit wires that are intersect each other.

In another embodiment, a semiconductor package comprises a semiconductor chip having a circuit unit and bonding pads and through holes electrically connected to the circuit unit; through electrode units respectively disposed in the through hole, including conductive polarization particles respectively having a first polarity and a second polarity opposite the first polarity and electrically connected to each other, and electrically connected to the bonding pad; and insulation units for insulating through electrodes.

The conductive polarization particles have conductive rheological maternal.

The bonding pads are respectively disposed at a position corresponding to the through hole.

The bonding pads are disposed over an edge of the upper surface of the semiconductor chip.

The semiconductor package may further comprise a conductive connection member for covering at least one end of the through electrode unit.

The conductive connection member may include an anisotropic conductive film having resin and conductive particles arranged within the resin.

Alternatively, the conductive connection member may include a conductive layer.

The conductive layer includes a solder.

The through hole and the bonding pad corresponding to the through hole are spaced apart from each other by a given distance.

The semiconductor package may further comprise a wiring unit for electrically connecting the through electrode unit and the bonding pad corresponding to the through electrode unit.

At least two semiconductor chips are stacked.

In accordance with the present invention, terminals of the circuit substrate are connected or a land pattern and a bonding pad of the semiconductor chip are electrically connected by a wiring unit in which conductive polarization particles are connected and an insulation unit that insulates the wiring unit. Therefore, it is possible to simplify the circuit wire forming process, facilitate fault detection of the circuit wire and form a circuit wire that intersects another circuit wire in the same plane.

Also, it is possible to form an electrode with no void that passes through the semiconductor chip in the semiconductor chip.

DESCRIPTION OF SPECIFIC EMBODIMENTS

Hereinafter, a circuit substrate, a method of manufacturing the circuit substrate, and a semiconductor package having circuit wires in accordance with embodiments of the present invention will be described in detail with reference to accompanying drawings.

Figure 1:
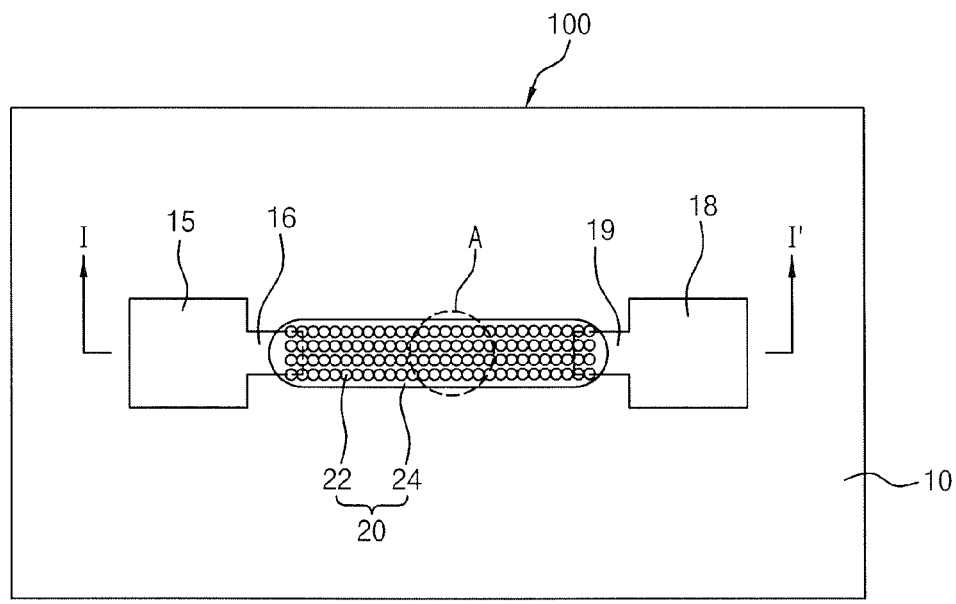
FIG. 1 is a plan view showing a circuit substrate in accordance with an embodiment of the present invention.
Figure 2:
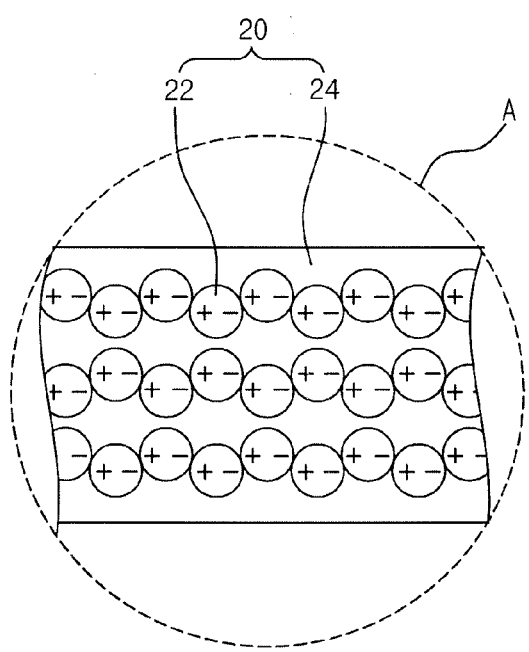
FIG. 2 is a partially enlarged view of a portion 'A' in FIG. 1.
Figure 3:
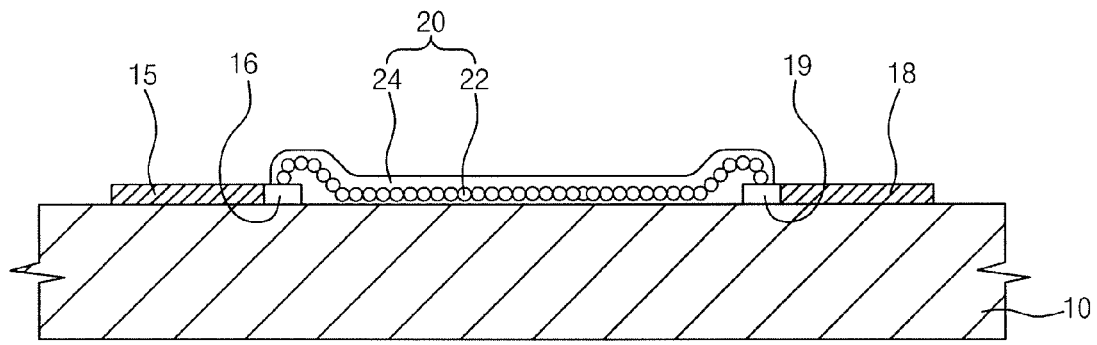
FIG. 3 is a cross-sectional view taken along line I-I' in FIG. 1.

FIG. 1 is a plan view showing a circuit substrate in accordance with an embodiment of the present invention. FIG. 2 is a partially enlarged view of a portion 'A' in FIG. 1. FIG. 3 is a sectional view taken along line I-I' in FIG. 1.

Referring to FIG. 1, a circuit substrate 100 includes a substrate body 10 and a circuit wire 20.

The substrate body 10 may have a plate shape, and may be a printed circuit board. Alternatively, the substrate body 10 may have a different shape and may be an insulation plate or a semiconductor chip.

A first terminal 15 and a second terminal 18 may be disposed over an upper surface of the substrate body 10, and the first terminal 15 and the second terminal 18 are separated from each other by a given distance over the upper surface of the substrate body 10.

In the present embodiment, the first terminal 15 and the second terminal 18 may be conductive plates. For example, the first terminal 15 and the second terminal 18 may be metal plates having excellent conductivity.

The first terminal 15 and the second terminal 18 may be formed of a conductive material such as copper, copper alloy, aluminum, aluminum alloy, silver, gold, gold alloy, or the like.

The first terminal 15 may include at least one first connection unit 16. The first connection unit 16 extends in a protrusion shape from the first terminal 15 along the upper surface of the substrate body 10. That is, the first connection unit 16 extends from the first terminal 15 along the upper surface of the substrate body 10, and the first connection unit 16 is more narrow than the first terminal 15.

The second terminal 18 may include at least one second connection unit 19. The second connection unit 19 extends in a protrusion shape from the second terminal 18 along the upper surface of the substrate body 10. That is, the second connection unit 19 extends from the second terminal 18 along the upper surface of the substrate body 10, and the second connection unit 19 is more narrow than the second terminal 18.

In the present embodiment, the first terminal 15 may be, an input terminal for receiving a signal, and the second terminal 18 may be an output terminal for outputting the signal received by the first terminal 15. However, it would also be possible that the first terminal 15 may be an output terminal and the second terminal 18 may be an input terminal.

In the present embodiment, when another conductive member is connected to the first terminal 15, the first connection unit 16 of the first terminal 15 prevents reductions in connectivity between the conductive member and the first terminal 15 caused by interference between the circuit wire 20, which will be described below, and the conductive member (not shown).

Similarly, when another conductive member is connected to the second terminal 18, the second connection unit 19 of the second terminal 18 prevents reductions in connectivity between the conductive member and the second terminal 18 caused by interference between the circuit wire 20 (which will be described below) and the conductive member (not shown).

The circuit wire 20 is, for example, electrically connected to both the first connection unit 16 of the first terminal 15 and the second connection unit 19 of the second terminal 18. Therefore, the signal inputted into the first terminal 15 is outputted from the second terminal 18.

The circuit wire 20 includes a wiring unit 22 and an insulation unit 24.

The wiring unit 22 includes a plurality of conductive polarization particles, which are shown in FIG. 2. In the present embodiment, the conductive polarization particles include conductive rheological material.

The conductive polarization particle has a first polarity and a second polarity, and the first polarity is opposite of the second polarity. In the present embodiment, for example, the first polarity may be (+) polarity and the second polarity may be (−) polarity.

Referring to FIG. 2, the plurality of the conductive polarization particles that form the wiring unit 22 are arranged continuously from the first connection unit 16 of the first terminal 15 to the second connection unit 19 of the second terminal 18. The first polarity of one conductive polarization particle faces the second polarity of adjacent conductive polarization particle, and the adjacent conductive polarization particles are electrically connected with each other. For example, in a plurality of conductive polarization particles having the first polarity is a (+) polarity and the second polarity is a (−) polarity, the (+) polarity of a conductive polarization particle will face the (−) polarity of a neighboring particle as shown in FIG. 2.

Referring to FIG. 3, a first end of the wiring unit 22 is electrically connected to the first connection unit 16 of the first terminal 15, and a second end of the wiring unit 22 opposite the first end is electrically connected to the second connection unit 19 of the second terminal 18.

The insulation unit 24 covers the wiring unit 22, which is electrically connecting the first connection unit 16 of the first terminal 15 and the second connection unit 19 of the second terminal 18. The wiring unit 22 is electrically insulated from other external conductive members (not shown) by the insulation unit 24. In addition, the insulation unit 24 secures the plurality of the conductive polarization particles forming the wiring unit 22 at given positions.

Figure 4:
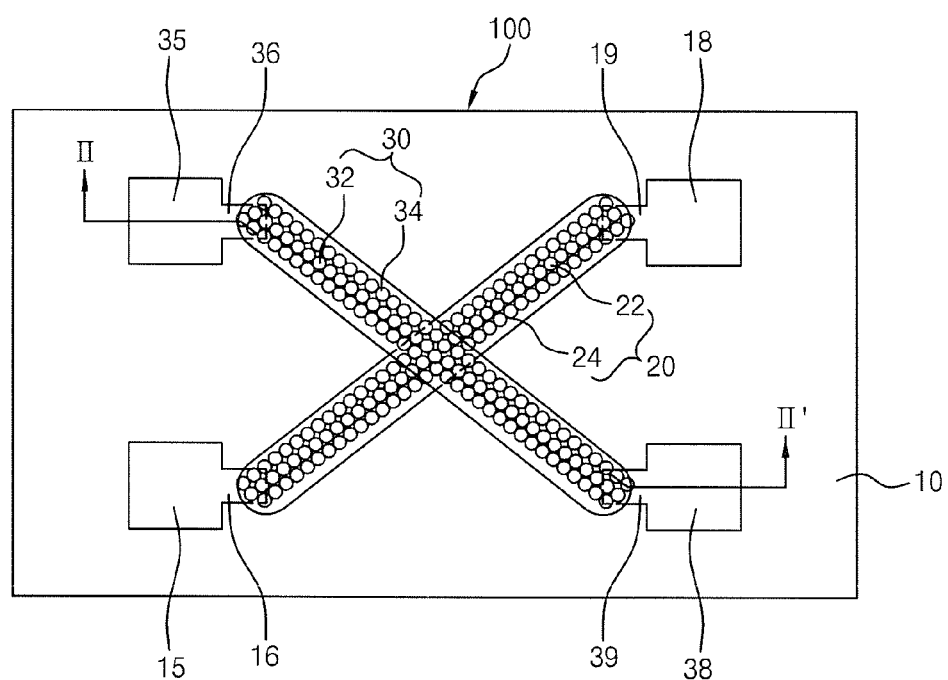
FIG. 4 is a plan view showing a circuit substrate in accordance with another embodiment of the present invention.
Figure 5:
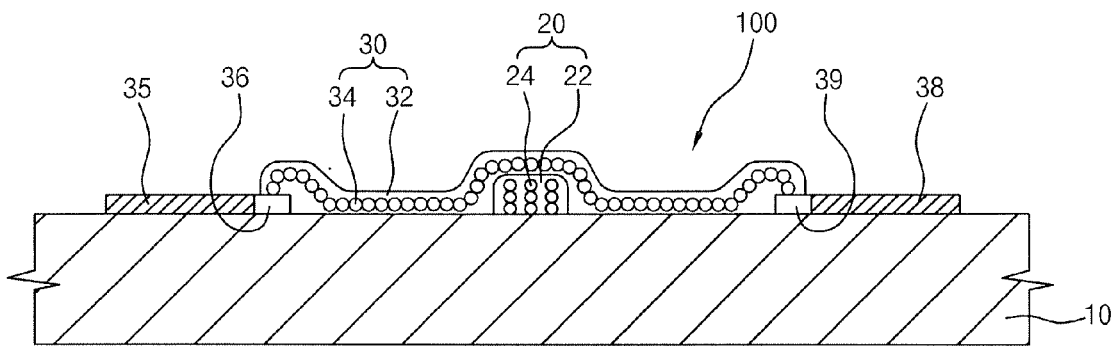
FIG. 5 is a cross-sectional view taken along line II-II' in FIG. 4.

FIG. 4 is a plan view showing a circuit substrate in accordance with another embodiment of the present invention. FIG. 5 is a cross-sectional view taken along line II-II' in FIG. 4.

Referring to FIGS. 4 and 5, a circuit substrate 100 includes a substrate body 10 and circuit wires 20 and 30.

The substrate body 10 may have a plate shape, and the substrate body 10 may be a printed circuit board. Alternatively, the substrate body 10 may have a different shape and may be an insulation plate or a semiconductor chip.

A first terminal 15, a second terminal 18, a third terminal 35, and a fourth terminal 38 are disposed over an upper surface of the substrate body 10.

The first and second terminals 15 and 18 are arranged over the substrate body 10 to be diagonally opposite each other, the third and fourth terminals 35 and 38 are disposed adjacent to the first and the second terminals 15 and 18, and the third and fourth terminals 35 and 38 are arranged over the substrate body 10 to be diagonally opposite each other.

In the present embodiment, the first through fourth terminals 15, 18, 35, and 38 may be conductive plates formed of a conductive material, such as copper, copper alloy, aluminum, aluminum alloy, silver, gold, gold alloy, or the like.

The first terminal 15 may include at least one first connection unit 16. The first connection unit 16 extends in a protrusion shape from the first terminal 15 along the upper surface of the substrate body 10. That is, the first connection unit 16 extends from the first terminal 15 along the upper surface of the substrate body 10, and the first connection unit 16 is more narrow than the first terminal 15.

The second terminal 18 may include at least one second connection unit 19. The second connection unit 19 extends in a protrusion shape from the second terminal 18 along the upper surface of the substrate body 10. That is, the second connection unit 19 extends from the second terminal 18 along the upper surface of the substrate body 10, and the second connection unit 19 is more narrow than the second terminal 18.

The third terminal 35 may include at least one third connection unit 36. The third connection unit 36 extends in a protrusion shape from the third terminal 35 along the upper surface of the substrate body 10. That is, the third connection unit 36 extends from the third terminal 35 along the upper surface of the substrate body 10, and the third connection unit 36 is more narrow than the third terminal 35.

The fourth terminal 38 may include at least one fourth connection unit 39. The fourth connection unit 39 extends in a protrusion shape from the fourth terminal 38 along the upper surface of the substrate body 10. That is, the fourth connection unit 39 extends from the fourth terminal 38 along the upper surface of the substrate body 10, and the fourth connection unit 39 is more narrow than the fourth terminal 38.

In the present embodiment, the first and third terminals 15 and 35 may be input terminals for receiving signals, and the second and fourth terminals 18 and 38 may be output terminals for outputting the signal received by the first and third terminals 15 and 35. However, it would also be possible that the first and third terminals 15 and 35 may be output terminals and the second and fourth terminals 18 and 38 may be input terminals.

In the present embodiment, when other conductive members are connected to the first through fourth terminals 15, 18, 35, 38, the first through fourth connection units 16, 19, 36, and 39 of the first through fourth terminals 15, 18, 35, and 38 prevent, reductions in connectivity between the conductive members and the first through fourth terminals 15, 18, 35, and 38 caused by the circuit wires 20 and 30 (which will be described below).

The circuit wires 20 and 30 include a first circuit wire 20 and a second circuit wire 30.

For example, the first circuit wire 20 electrically connects the first terminal 15 and the second terminal 18, and the first circuit wire 20 includes a first wiring unit 22 and a first insulation unit 24.

The first wiring unit 22 includes a plurality of conductive polarization particles. In the present embodiment, the conductive polarization particles include conductive rheological material.

The conductive polarization particle has a first polarity and a second polarity, and the first polarity is the opposite of the second polarity. In the present embodiment, for example, the first polarity may be (+) polarity and the second polarity may be (−) polarity.

The plurality of conductive polarization particles forming the first wiring unit 22 are arranged continuously from the first connection unit 16 of the first terminal 15 to the second connection unit 19 of the second terminal 18. The first polarity of one conductive polarization particle faces the second polarity of adjacent conductive polarization particle, and the adjacent conductive polarization particles are electrically connected to each other. For example, in a plurality of conductive polarization particles having the first polarity is a (+) polarity and the second polarity is a (−) polarity, the (+) polarity of a particle with face the (−) polarity of a neighboring particle as shown in FIG. 2.

The first end of the first wiring unit 22 is electrically connected to the first connection unit 16 of the first terminal 15, and the second end of the first wiring unit 22 opposite the first end is electrically connected to the second connection unit 19 of the second terminal 18.

The first insulation unit 24 covers the first wiring unit 22, which is electrically connecting the first connection unit 16 of the first terminal 15 and the second connection unit 19 of the second terminal 18. The first wiring unit 22 is electrically insulated from other external conductive members by the first insulation unit 24. In addition, the first insulation unit 24 secures the plurality of the conductive polarization particles forming the first wiring unit 22 at given positions.

The second circuit wire 30 electrically connects the third terminal 35 and the fourth terminal 38 and thus a portion of the second circuit wire 30 intersects the first circuit wire 20. In other words, a portion of the second circuit wire 30 is disposed over an upper surface of the first circuit wire 20.

The second circuit wire 30 includes a second wiring unit 32 and a second insulation unit 34.

The second wiring unit 32 includes a plurality of conductive polarization particles. In the present embodiment, the conductive polarization particles include conductive rheological material.

The conductive polarization particle has a first polarity and a second polarity, and the first polarity is the opposite of the second polarity. In the present embodiment, for example, the first polarity may be (+) polarity and the second polarity may be (−) polarity.

The plurality of the conductive polarization particles forming the second wiring unit 32 are arranged continuously from the third connection unit 36 of the third terminal 35 to the fourth connection unit 39 of the fourth terminal 38. The first polarity of one conductive polarization particle faces the second polarity of adjacent conductive polarization particle, and the adjacent conductive polarization particles are electrically connected to each other, as discussed above.

A first end of the second wiring unit 32 is electrically connected to the third connection unit 36 of the third terminal 35 and a second end of the second wiring unit 32 opposite the first end is electrically connected to the fourth connection unit 39 of the fourth terminal 38.

The second insulation unit 34 covers the second wiring unit 32 electrically connecting the third connection unit 36 of the third terminal 35 and the fourth connection unit 39 of the fourth terminal 38. The second wiring unit 32 is electrically insulated from other external conductive members by the second insulation unit 34. In addition, the second insulation unit 34 secures the plurality of the conductive polarization particles forming the second wiring unit 32 at given positions.

In the present embodiment, a portion of the second circuit wire 30 is disposed over the first circuit wire 20. However, the first circuit wire 20 and the second circuit wire 30 are not electrically shorted because the first wiring unit 22 of the first circuit wire 20 is insulated by the first insulation unit 24 and the second wiring unit 32 of the second circuit wire 30 is insulated by the second insulation unit 34.

Therefore, it is possible to form a plurality of circuit wires that intersect each other over the substrate body 10, and the plurality of circuit wires will not electrically short with each other.

Figure 6:
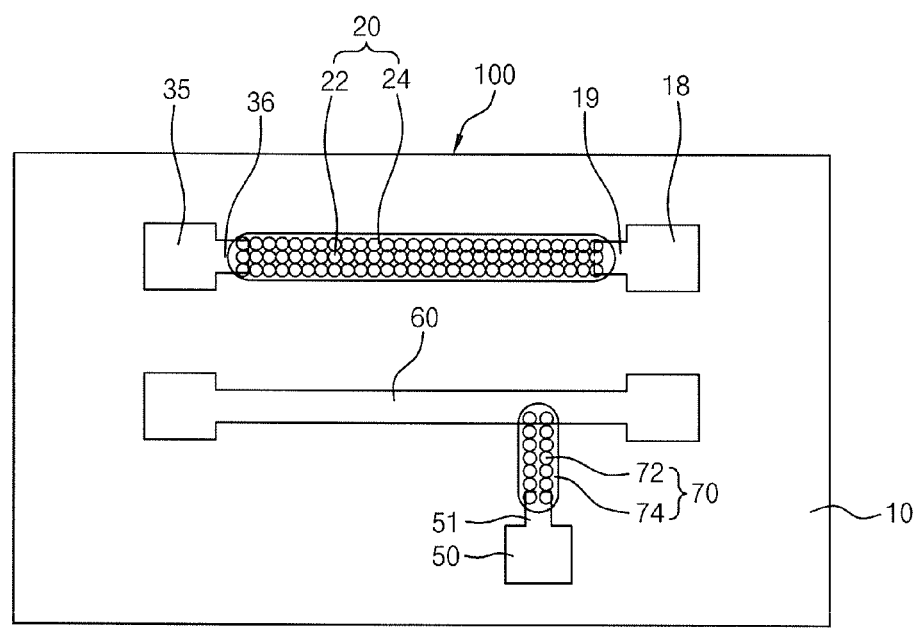
FIG. 6 is a plan view showing a circuit substrate in accordance with another embodiment of the present invention.

FIG. 6 is a plan view showing a circuit substrate in accordance with another embodiment of the present invention. The circuit substrate in accordance with the present embodiment is the same as the circuit substrate shown in and described with reference to FIG. 1, with the exception of the third terminal, a metal wire, and a second circuit wire included in the embodiment shown in FIG. 6. Therefore, the same name and reference numerals will be given to the same components.

Referring to FIG. 6, a circuit substrate 100 includes a substrate body 10, a first terminal 15, a second terminal 18, a first circuit wire 20, a third terminal 50, a metal wire 60 and a second circuit wire 70.

The first terminal 15 formed over the substrate body 10 includes a first connection unit 16 protruding from the first terminal 15, and the second terminal 18 includes a second connection unit 19 protruding from the second terminal 18. The third terminal 50 is spaced apart from the first and second terminals 15 and 18, and includes a third connection unit 51 protruding from the third terminal 50.

The first circuit wire 20 includes a first wiring unit 22 having conductive polarization particles and a first insulation unit 24 for insulating the first wiring unit 22. A first end of the first circuit wire 20, which is electrically connected to the first connection unit 16, and a second end of the first circuit wire 20, opposite the first end, which is electrically connected to the second connection unit 19.

The metal wire 60 is disposed over the substrate body 10 and may have in a linear shape.

The second circuit wire 70 includes a second wiring unit 72, having conductive polarization particles, and a second insulation unit 74, for insulating the second wiring unit 72. A first end of the second wire 70 is electrically connected to the metal wire 60 and a second end of the second wire 70 opposite of the first end is electrically connected to the third connection unit 51 of the third terminal 50.

Figure 7:
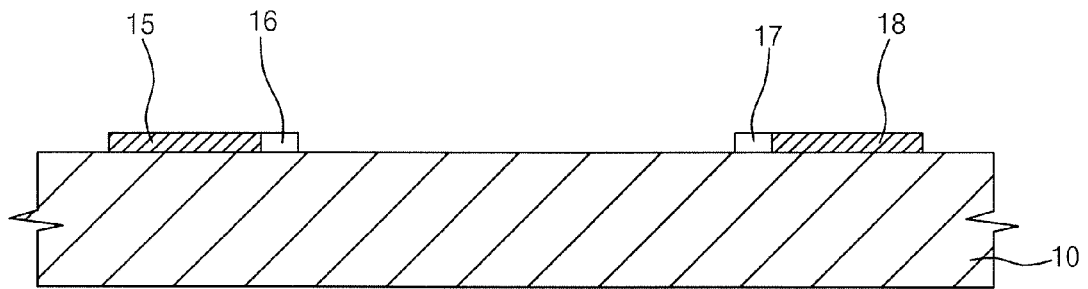
FIGS. 7 through 9 are cross-sectional views showing the steps of a method of manufacturing a circuit substrate in accordance with an embodiment of the present invention.
Figure 8:
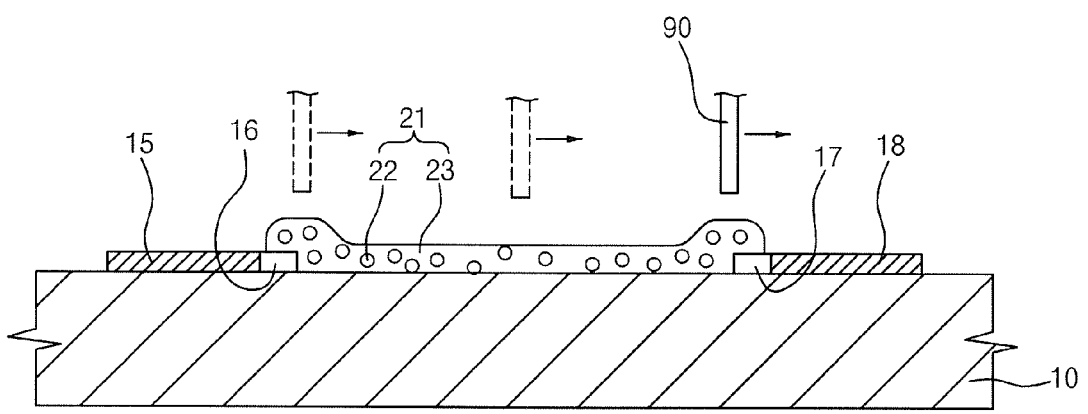
Figure 9:
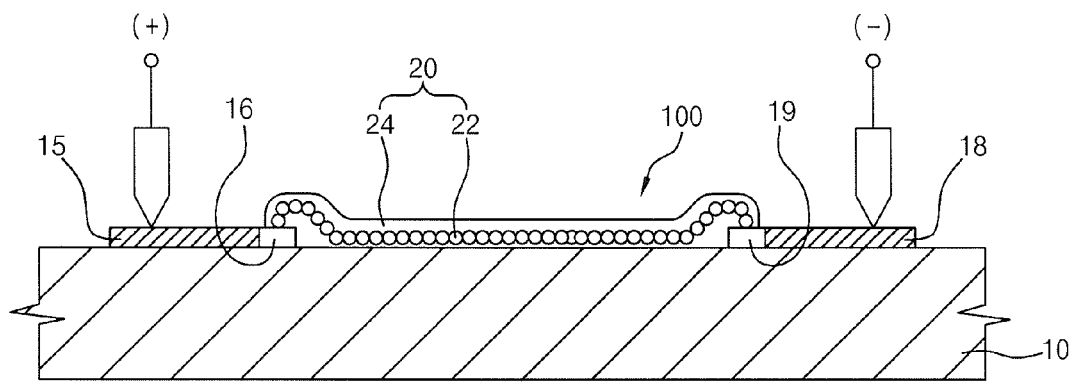

FIGS. 7 through 9 are cross-sectional views showing the steps of a method of manufacturing a circuit substrate in accordance with an embodiment of the present invention.

Referring to FIG. 7, a step of preparing the substrate body 10 having a plate shape is carried out in order to manufacture the circuit substrate.

In order to manufacture the circuit substrate, a first terminal 15, having a protruded first connection unit 16, and the second terminal 18, having a protruded second connection unit 19, are formed over the substrate body. The first terminal 15 and the second terminal 18 are separated from each other by a predetermined distance.

Referring to FIG. 8, a preliminary circuit wire 21 is formed over the circuit substrate 10. The preliminary circuit wire 21 includes a circuit wire material, in which conductive polarization particles 22 and a flowable insulator 23 are mixed.

The conductive polarization particle includes a first polarity and a second polarity opposite the first polarity. The conductive polarization particles of the preliminary circuit wire 21 are irregularly distributed within the flowable insulator 23. In the present embodiment, the conductive polarization particles 22 include conductive rheological material.

The flowable insulator 23 may include insulation material such as synthetic resin dissolved in a volatile solvent. The flowable insulator 23 has excellent flowability and thus the bead-shaped conductive polarization particles 22 can move freely within the flowable insulator 23.

In the present embodiment, a first end of the preliminary circuit wire 21 is disposed over the first connection unit 16, and a second end of the preliminary circuit wire 21, opposite the first end, is disposed over the second connection unit 19. In the present embodiment, the first and second ends of the preliminary circuit wire 21 are not electrically connected to the first and second connection units 16 and 19.

The preliminary circuit wire 21, which has excellent flowability, may be formed in a band shape at a given position on the substrate body 10 by a dispenser 90 or the like. Alternatively, the preliminary circuit wire 21 having excellent flowability may be printed in a band shape at a given position on the substrate body 10 by a printing process or the like. Alternatively, the preliminary circuit wire 21 having excellent flowability may be formed at a given position on the substrate body 10 by a silk screen printing process or the like.

Referring to FIG. 9, after the preliminary circuit wire 21 connecting the first terminal 15 and the second terminal 18 is formed over the substrate 10, first power having a first polarity, for example, (+) polarity, is applied to the first terminal 15, and a second power having a second polarity opposite the first polarity, for example, (−) polarity, is applied to the second terminal 18.

When the first power having the first polarity is applied to the first terminal 15 and the second power having a second polarity is applied to the second terminal 18, the conductive polarization particles contained in the preliminary circuit wire 21 are rearranged by the first power and the second power and the adjacent conductive polarization particles are electrically connected with opposite polarities thereof facing each other, thereby forming a first wiring unit 22 for electrically connecting the first and second connection units 16 and 19.

Then, the flowable insulator shown in FIG. 8 is cured to both prevent the position of the conductive polarization particles from changing and to insulate the first wiring unit 22, thereby forming a circuit wire 20 having a first insulation unit 24 covering the first wiring unit 22.

Although a method of manufacturing the circuit substrate 100 including one circuit wire 20 having the first wiring unit 22 and the first insulation unit 24 is described and shown in the present embodiment, it is also possible to form a plurality of circuit wires over the substrate body 10 after forming the circuit wire 20. At this time, since the first wiring units included in respective circuit wire are insulated by respective first insulation unit, it is possible to prevent shorts occurring between the circuit wires 20 as discussed above.

Figure 10:
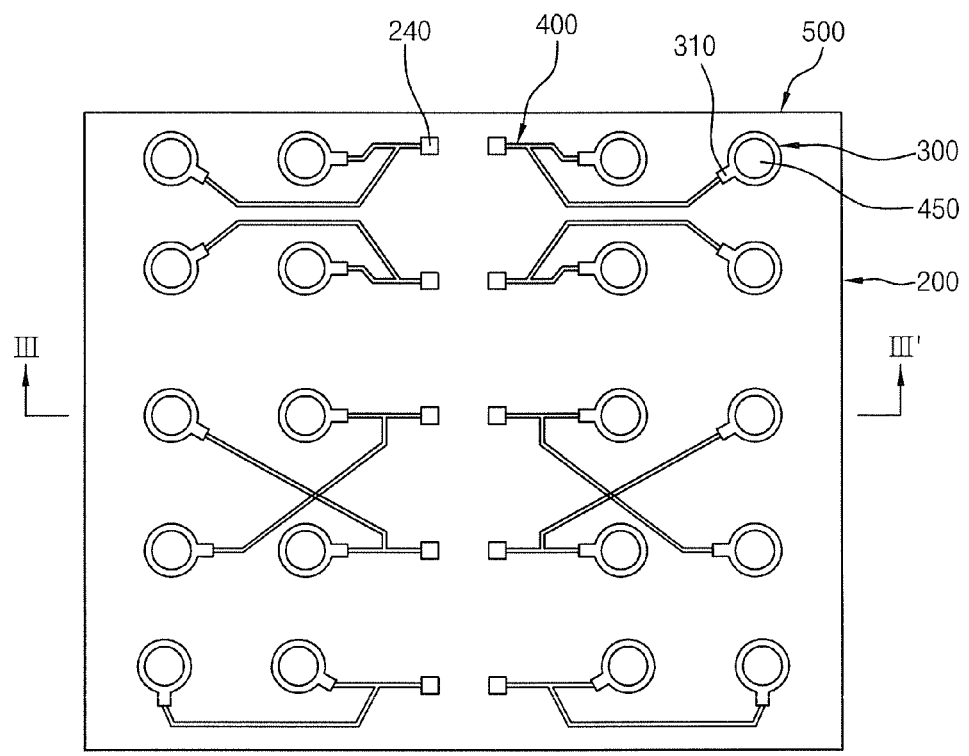
FIG. 10 is a plan view showing a semiconductor package including circuit wires in accordance with an embodiment of the present invention.
Figure 11:
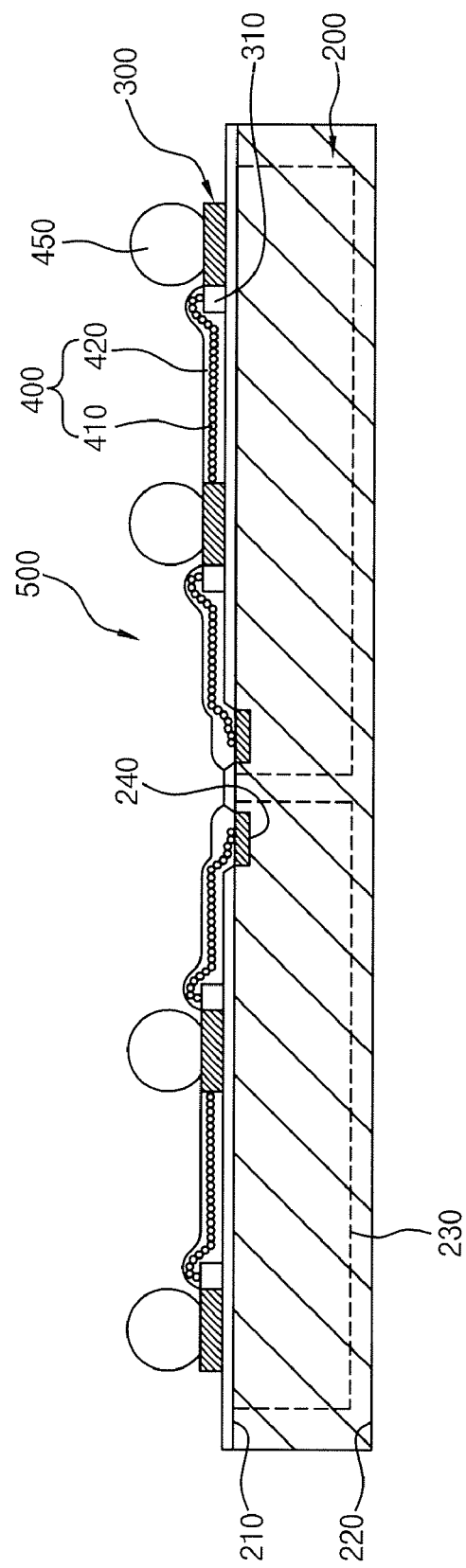
FIG. 11 is a cross-sectional view taken along line III-III' in FIG. 10.

FIG. 10 is a plan view showing a semiconductor package including circuit wires in accordance with an embodiment of the present invention. FIG. 11 is a cross-sectional view taken along line III-III' in FIG. 10.

Referring to FIGS. 10 and 11, a semiconductor package 500 includes a semiconductor chip 200, conductive land patterns 300, and circuit wires 400.

The semiconductor chip 200 has, for example, a rectangular parallelepiped shape. That is, the semiconductor chip 200 may have the shape of a polyhedron with six faces (hexahedron), and each face is a parallelogram. The semiconductor chip 200 having a rectangular parallelepiped shape has an upper surface 210 and a lower surface 220, opposite the upper surface 210.

The semiconductor chip 200 includes a circuit unit 230 and bonding pads 240.

The circuit unit 230 includes a data storing unit (not shown) for storing data and a data processing unit (not shown) for processing the data.

The bonding pads 240 are disposed on a central portion of the upper surface 210 of the semiconductor chip 200, and the bonding pads 240 are electrically connected to the circuit unit 230.

The land patterns 300 are disposed over the upper surface 210 of the semiconductor chip 200. The land patterns 300 are disposed, for example, at both sides of the bonding pads 240, respectively.

In the present embodiment, the land patterns 300 are respectively disposed over the upper surface 210 of the semiconductor chip 200 in the shape of an island. That is, for example, the land pattern 300 may be shaped like a circular disc and disposed over the upper surface 210 of the semiconductor chip 200 in accordance with a regulation of Joint Electron Device Engineering Council (JEDEC).

The land pattern 300 may be an anisotropic conductive film (ACF). Alternatively, the land pattern 300 may be a metal plate disposed over the upper surface 210 of the semiconductor chip 200.

A connection member 450 is disposed over the land pattern 300. The connection member 450 may include, for example, a solder.

Meanwhile, the land pattern 300 may further include a connection unit 310 extending from a side face of the land pattern 300 along the upper surface 210 of the semiconductor chip 200.

The connection unit 310 extending from the side face of the land pattern 300 can prevent reduced connection area between the connection member 450 and the land pattern 300 due to disposition of the circuit wire 400 (which will be described later) over the land pattern 300, and faulty connectivity between the connection member 450 and the land pattern 300 that could result if the circuit wire 400 was formed over a portion of the land pattern 300.

The circuit wire 400 may be electrically connected to the connection unit 310 of the land pattern 300 and the bonding pad 240, and thus a signal inputted into the land pattern 300 is outputted from the bonding pad 240.

Referring to FIG. 11, each circuit wire 400 includes a wiring unit 410 and an insulation unit 420.

The wiring unit 410 includes a plurality of conductive polarization particles. In the present embodiment, the conductive polarization particles include conductive rheological material.

The conductive polarization particle has a first polarity and a second polarity, which is opposite the first polarity. In the present embodiment, for example, the first polarity may be (+) polarity and the second polarity may be (−) polarity.

The plurality of the conductive polarization particles that form the wiring unit 410 are arranged continuously from the bonding pad 240 to the connection unit 310 of the land pattern 300. One conductive polarization particle is electrically connected to the adjacent conductive polarization particle, and the first polarity of one conductive polarization particle faces the second polarity of adjacent conductive polarization particle. For example, in a plurality of conductive polarization particles having the first polarity is a (+) polarity and the second polarity is a (−) polarity, the (+) polarity of a conductive polarization particle will face the (−) polarity of a neighboring particle as shown in FIG. 2.

The insulation unit 420 covers the wiring unit 410 and thus the wiring unit 410 is insulated from other conductive members. In addition, the insulation unit 420 secures the plurality of the conductive polarization particles forming the wiring unit 410 at given positions.

In the present embodiment, a portion of the circuit wires 400 having the wiring unit 410 and the insulation unit 420 may intersect each other over the upper surface 210 of the semiconductor chip 200, and due to the insulation unit 420, the intersecting circuit wires 400 will not short each other.

Figure 12:
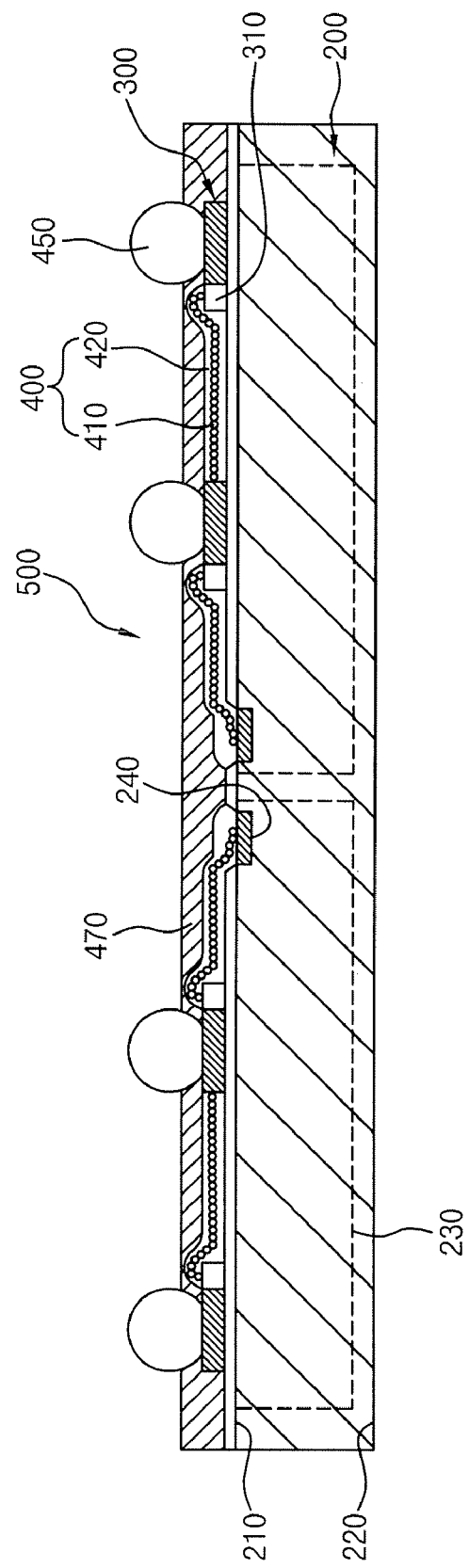
FIG. 12 is a cross-sectional view showing a solder resist pattern formed over the semiconductor chip shown in FIG. 11.

FIG. 12 is a cross-sectional view showing a solder resist pattern 470 formed over the semiconductor chip shown in FIG. 11.

Referring to FIG. 12, after the circuit wire 400 for electrically connecting the bonding pad 240 and the land pattern is formed over the semiconductor chip 200, a solder resist pattern 470 having an opening for exposing the land pattern 300 is formed over the upper surface of the semiconductor chip 200 to prevent damage to the circuit wire 400 and spreading of the connection member 450 when the connection member 450 is formed over the land pattern 300. The solder resist pattern 470 may include, for example, photoresist material.

Figure 13:
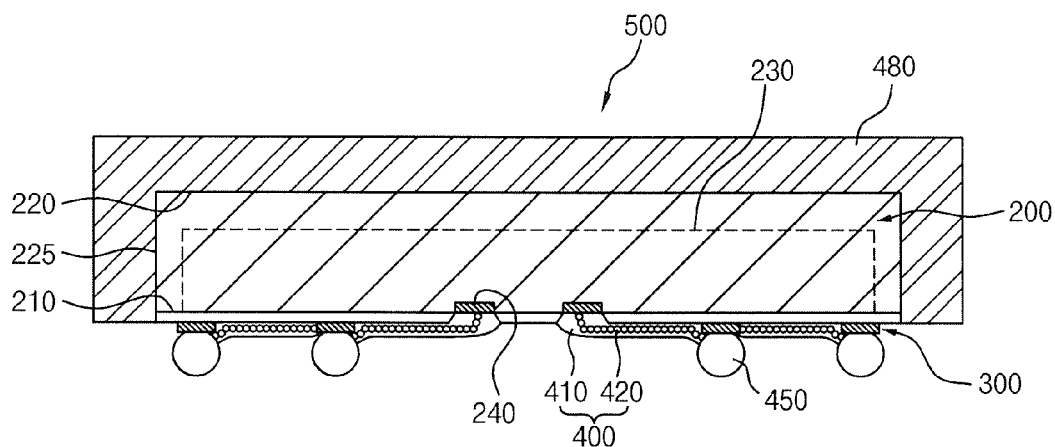
FIG. 13 is a cross-sectional view showing a semiconductor package in accordance with another embodiment of the present invention.

FIG. 13 is a cross-sectional view showing a semiconductor package in accordance with another embodiment of the present invention, which has substantially the same configuration as the semiconductor package shown in FIG. 10, except for a molding member that is not included in the semiconductor package illustrated in FIG. 10. Therefore, descriptions of the same components will be omitted and the same names and reference numerals will be given to the same components.

Referring to FIG. 13, the semiconductor package 500 includes the semiconductor chip 200, the conductive land patterns 300, the circuit wires 400, and a molding member 480.

The molding member 480 covers the lower surface 220 and side surfaces 225 connected with the lower surface 220 of the semiconductor chip 200, and the molding member 480 prevents damage and/or breakdown of the semiconductor chip 200 caused by external impact and/or vibration.

The molding member 480 may be formed of a material such as an epoxy resin. In the present embodiment, the semiconductor package 500 formed with the molding member 480 may be directly mounted over a printed circuit board, or the like, using the connection member 450.

Figure 14:
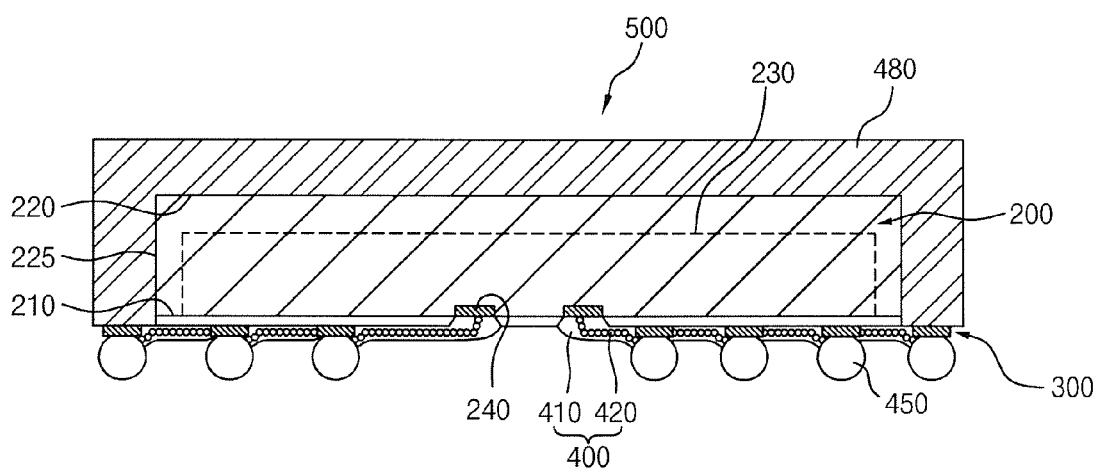
FIG. 14 is a cross-sectional view showing a semiconductor package in accordance with another embodiment of the present invention.

FIG. 14 is a cross-sectional view showing a semiconductor package in accordance with another embodiment of the present invention, which has substantially the same configuration as the semiconductor package shown in FIG. 13, except for the arrangement of the connection members. Therefore, descriptions of the same components will be omitted and the same names and reference numerals will be given to the same components.

Referring to FIG. 14, the semiconductor package 500 includes the semiconductor chip 200, the conductive land patterns 300, the circuit wires 400, the molding member 480, and the connection member 450.

When the semiconductor chip 200 in accordance with the present embodiment is very small, it is difficult to dispose the conductive land pattern 300 over the semiconductor chip in accordance with the regulations of JEDEC.

In the present embodiment, in order to form the conductive land patterns 300 and connection members 450 over the conductive land patterns 300 in the semiconductor package having the very small semiconductor chip 200 in accordance with the regulations of JEDEC, a portion (i.e., some) of the conductive land patterns 300 are formed over the upper surface 210 of the semiconductor chip 200 and the remaining conductive land patterns 300 are disposed over the molding member 480. Therefore, when the size of the semiconductor chip 200 is unsuitable to form the conductive land patterns 300 in accordance with the regulation of JEDEC, it is possible to form the conductive land patterns 300 so as to conform to the regulation of JEDEC by forming a portion (i.e., some) of the conductive land patterns 300 on the molding member 480.

Figure 15:
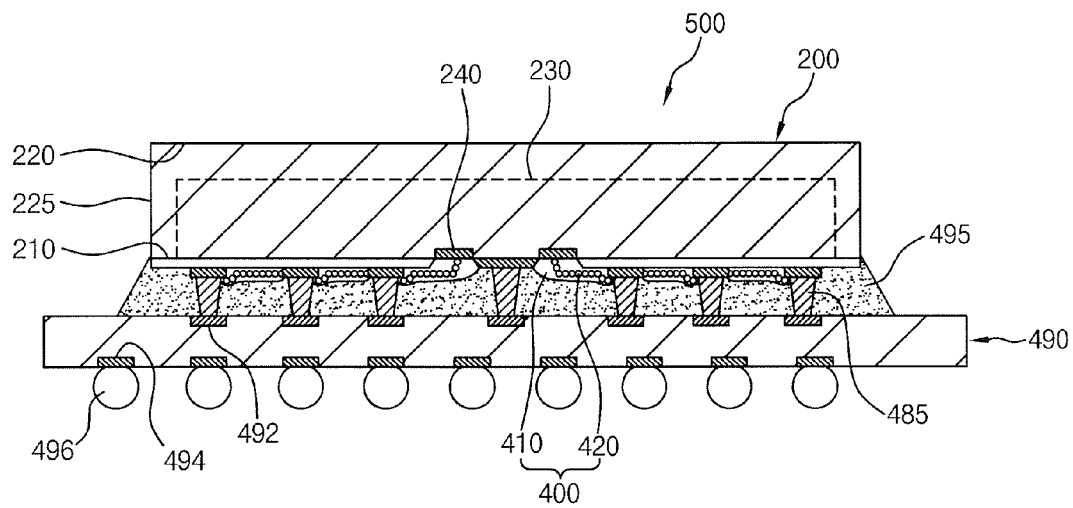
FIG. 15 is a cross-sectional view showing a semiconductor package in accordance with another embodiment of the present invention.

FIG. 15 is a cross-sectional view showing a semiconductor package in accordance with another embodiment of the present invention, which has substantially the same configuration as the semiconductor package shown in FIG. 10, except for the substrate, a bump, and a gap filling member, which are not included in FIG. 10. Therefore, descriptions of the same components will be omitted and the same names and reference numerals will be given to the same components.

Referring to FIG. 15, the semiconductor package 500 includes the semiconductor chip 200, the conductive land patterns 300, the circuit wires 400, a plurality of bump 485, a substrate 490, and a gap filling member 495.

A bump 485, in the shape of an island and connected to the circuit wire 400, is disposed in respective conductive land patterns 300, which are disposed over the upper surface 210 of the semiconductor chip 200.

The bump 485 may have a column shape and may be formed of a conductive material such as gold, gold alloy, silver, silver alloy, aluminum, aluminum alloy, or the like.

The substrate 490 includes connection pads 492, ball land patterns 494, and connection members 496.

The connection pads 492 are disposed over an upper surface of the substrate 490 having a plate shape, at positions corresponding to the bumps 485 of the semiconductor chip 200 and the connection pads 492, which are electrically connected to the bumps 485.

The ball land pattern 494 is disposed over the lower surface of the substrate 490 and the ball land pattern 494 is electrically connected to the connection pad 492 of the substrate 490.

The connection members 496 are disposed over the ball land pattern 494 and the connection members 496 may be, for example, conductive balls including formed of a low melting point metal, such as a solder.

The gap filling member 495 is disposed in the gap formed between the upper surface 210 of the semiconductor chip 200 and the upper surface of the substrate 490.

Figure 16:
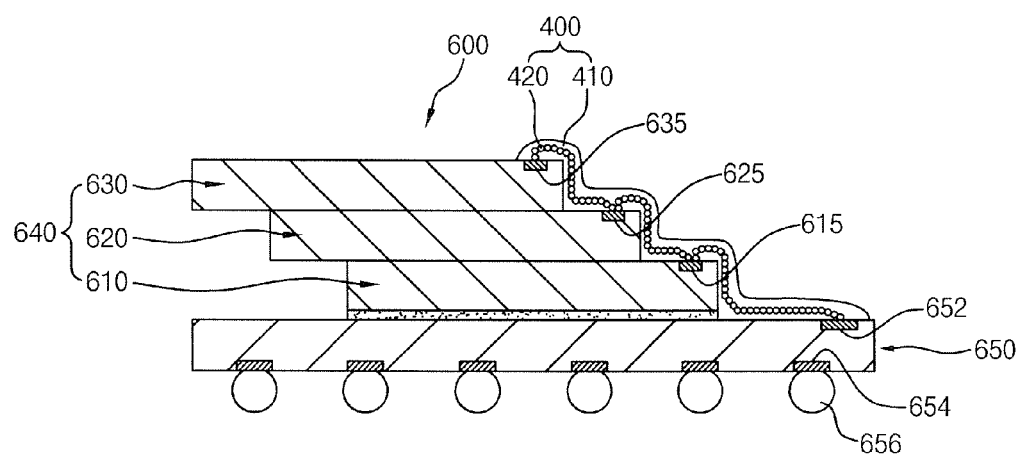
FIG. 16 is a cross-sectional view showing a semiconductor package in accordance with another embodiment of the present invention.

FIG. 16 is a cross-sectional view showing a semiconductor package in accordance with another embodiment of the present invention.

Referring to FIG. 16, the semiconductor package 600 includes a semiconductor chip module 640, a circuit wire 400, and a substrate 650.

The semiconductor chip module 640 includes a plurality of semiconductor chips 610, 620, and 630. The semiconductor chips 610, 620, and 630 include bonding pads 615, 625 and, 635 respectively, and the bonding pads 615, 625, and 635 are disposed along respective edges of the upper surfaces of the semiconductor chips 610, 620, and 630. In the present embodiment, the bonding pads 615, 625, and 635 are data bonding pads for inputting and/or outputting data.

The semiconductor chips 610, 620, and 630 included in the semiconductor chip module 640 are stacked in a stepped shape, and thus the bonding pads 615, 625, and 635 included in the respective semiconductor chips 610, 620, and 630 are exposed to the outside. That is the semiconductor chips 610, 620, and 630 are disposed in a staggered pattern such that the respective bonding pads 615, 625, and 630 are all exposed to the outside as shown in FIG. 16.

The circuit wires 400, which include a wiring unit 410 having a plurality of conductive polarization particles and an insulation unit 420 for insulating the wiring unit 410, electrically connect the exposed bonding pads 615, 625 and 635. For example, bonding pads selected from the plurality of bonding pads 615, 625, and 635 included in the respective semiconductor chips 610, 620, and 630 are electrically connected by the circuit wires 400.

The substrate 650 may include a printed circuit board, and the semiconductor chip module 640 is mounted over the upper surface of the substrate 650.

The substrate 650 includes connection pads 652, the ball land pattern 654 and connection members 656. The connection pad 652 is disposed over the upper surface of the substrate 650, and the portions of the circuit wires 400 electrically connected with the bonding pads 615, 625, and 635 of the semiconductor chips 610, 620, and 630 are electrically connected to the connection member 656.

The ball land patterns 654 are disposed over the lower surface of the substrate 650 and are electrically connected to the connection pads 652.

The connection member 656 is a conductive ball including a low melting point metal, such as a solder.

Figure 17:
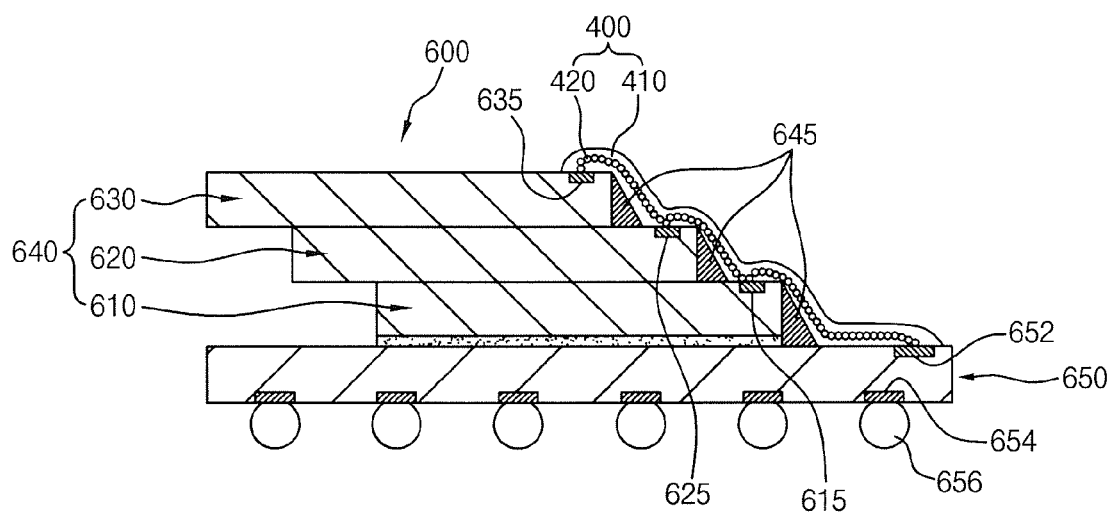
FIG. 17 is a cross-sectional view showing a semiconductor package in accordance with another embodiment of the present invention.

FIG. 17 is a cross-sectional view showing a semiconductor package in accordance with another embodiment of the present invention, which has substantially the same configuration as the semiconductor package shown in FIG. 16, except for a guide member. Therefore, descriptions of the same components will be omitted and the same names and reference numerals will be given to the same components.

The semiconductor package 600 includes the semiconductor chip module 640, the circuit wire 400, a guide member 645, and the substrate 650.

The guide member 645 is disposed over the side surface of the respective semiconductor chips 610, 620, and 630 of the semiconductor chip module on which the circuit wire passes. In the present embodiment, the guide member 645 has, for example, a wedge-like shape of a triangular column, such that the circuit wire 400 is disposed over the inclined plane of the guide member 645 as shown in FIG. 17. The guide member 645 allows the circuit wire 400 and respective upper surfaces of the semiconductor chips 610, 620 and 630 to form a gentle angle (i.e., larger angle), thus preventing the circuit wire 400 from being cut during formation of the circuit wire 400.

Figure 18:
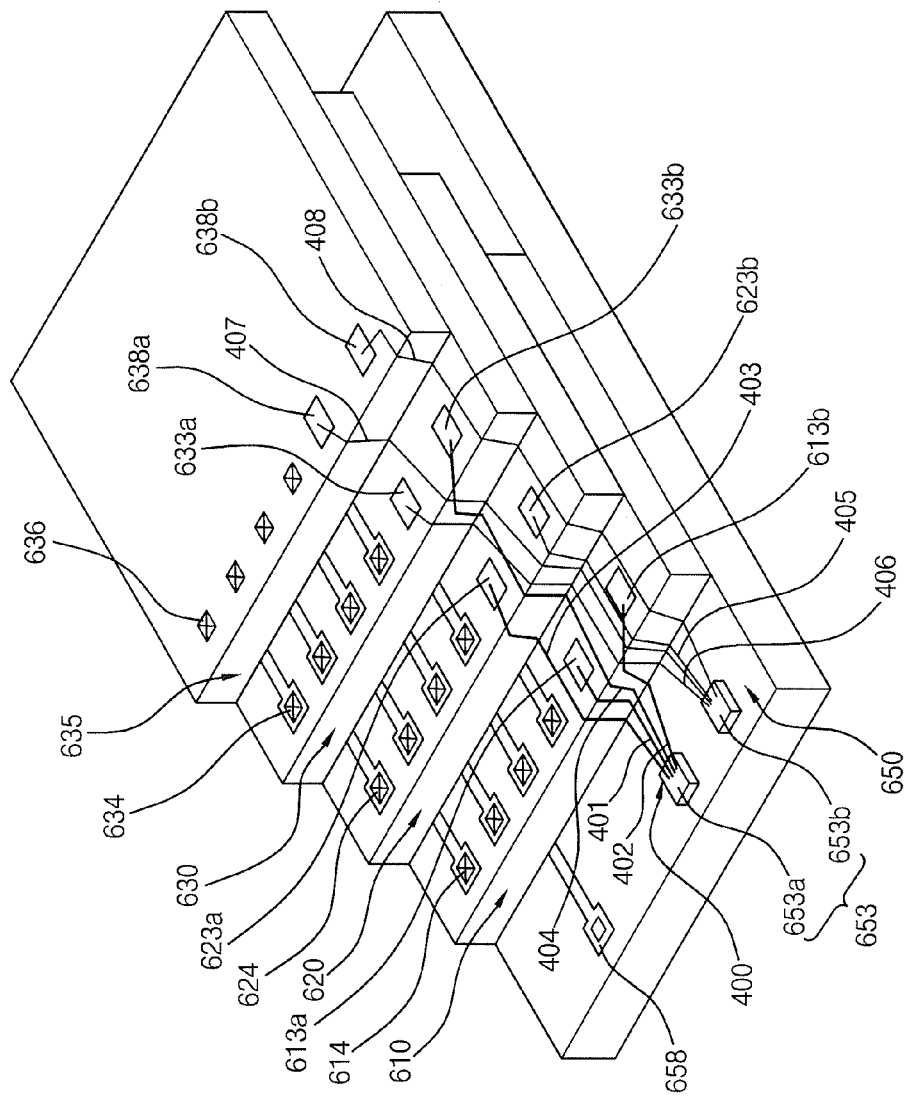
FIG. 18 is a perspective view showing a semiconductor package in accordance with another embodiment of the present invention.

FIG. 18 is a perspective view showing a semiconductor package in accordance with another embodiment of the present invention, which has substantially the same configuration as the semiconductor package shown in FIG. 16, except for a signal applying pad and a chip selection pad. Therefore, descriptions of the same components will be omitted and the same names and reference numerals will be given to the same components.

The semiconductor package 600 includes the semiconductor chip module 640, the circuit wire 400, and the substrate 650.

In the present embodiment, the semiconductor chip module 640 includes, for example, first through fourth semiconductor chips 610, 620, 630, and 635. However the semiconductor chips may be different in number as well.

The first semiconductor chip 610 includes data bonding pads 614 and chip selection pads 613a and 613b. The data bonding pads 614 and the chip selection pads 613a and 613b are disposed along an edge of the first semiconductor chip 610.

The second semiconductor chip 620 includes data bonding pads 624 and chip selection pads 623a and 623b. The data bonding pads 624 and the chip selection pads 623a and 623b are disposed along an edge of the second semiconductor chip 620.

The third semiconductor chip 630 includes data bonding pads 634 and chip selection pads 633a and 633b. The data bonding pads 634 and the chip selection pads 633a and 633b are disposed along an edge of the third semiconductor chip 630.

The fourth semiconductor chip 635 includes data bonding pads 636 and chip selection pads 638a and 638b. The data bonding pads 636 and the chip selection pads 638a and 638b are disposed along an edge of the fourth semiconductor chip 635.

In the present embodiment, respective data bonding pads 614, 624, 634, and 636 of the first through fourth semiconductor chips 610, 620, 630, and 635 are electrically connected to each other by redistributions and through electrodes.

The substrate 650 includes data connection pads 658 and chip selection connection pads 653.

The data connection pads 658 of the substrate 650 are electrically connected to respective data bonding pads 614, 624, 634, and 636.

The chip selection connection pad 653 of the substrate 650 includes a first chip selection connection pad 653a and a second chip selection connection pad 653b. A first signal is applied to the first chip selection connection pad 653a and a second signal is applied to the second chip selection connection pad 653b.

The circuit wires 400 electrically connect the chip selection connection pads 653 and the chip selection pads 613a, 613b, 623a, 623b, 633a, 633b, 638a, and 638b of the first through fourth semiconductor chips 610, 620, 630, and 635. In the present embodiment, the circuit wires 400 are respectively defined as a first through eighth circuit wires 401~408. In the present embodiment, each of the first through eighth circuit wires 401~408 include a wiring unit containing conductive polarization particles and an insulation unit for insulating the wiring unit.

Specifically, the first circuit wire 401 electrically connects the first chip selection connection pad 653a and the chip selection pad 613a. The second circuit wire 402 electrically connects the first chip selection connection pad 653a and the chip selection pad 613b.

The third circuit wire 403 electrically connects the first chip selection connection pad 653a and the chip selection pad 623a. The fourth circuit wire 404 electrically connects the first chip selection connection pad 653a and the chip selection pad 633b.

The fifth circuit wire 405 electrically connects the second chip selection connection pad 653b and the chip selection pad 623b. The sixth circuit wire 406 electrically connects the second chip selection connection pad 653b and the chip selection pad 633a.

The seventh circuit wire 407 electrically connects the second chip selection connection pad 653b and the chip selection pad 638a. The eighth circuit wire 408 electrically connects the second chip selection connection pad 653b and the chip selection pad 638b.

The first through eighth circuit wires 401~408 may intersect each other over the first through fourth semiconductor chips 610, 620, 630, and 635, but the first through eighth circuit wires 401~408 are not shorted to each other because the insulation units of the first through eighth circuit wires 401~408 provide electrical insulation.

Figure 19:
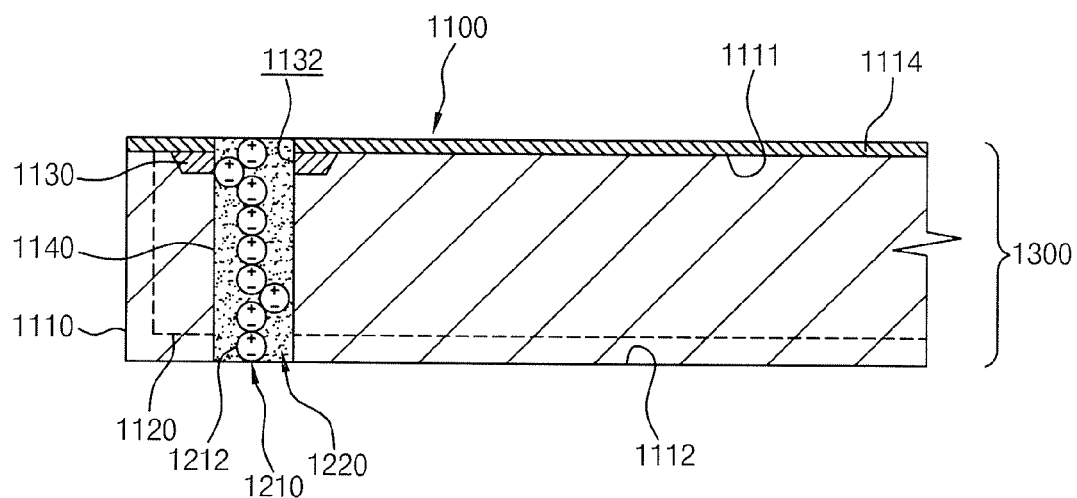
FIG. 19 is a cross-sectional view showing a semiconductor package in accordance with another embodiment of the present invention.

FIG. 19 is a cross-sectional view showing a semiconductor package in accordance with another embodiment of the present invention.

Referring to FIG. 19, the semiconductor package 1300 includes a semiconductor chip 1100, a through electrode unit 1210, and an insulation unit 1220.

The semiconductor chip 1100 includes a semiconductor chip body 1110, a circuit unit 1120, bonding pads 1130, and through holes 1140.

The semiconductor chip body 1110 may have, for example, a rectangular parallelepiped shape, and the semiconductor chip body 1110 having a rectangular parallelepiped shape includes a first surface 1111 and a second surface 1112 opposite the first surface 1111. That is, the semiconductor chip body 1110 may have the shape of a polyhedron with six faces (hexahedron), and each face is a parallelogram. In the present embodiment, a protective layer 1114, which exposes the bonding pads 1130 and the through holes 1140, is disposed over the first surface 1111 of the semiconductor chip body 1110.

The circuit unit 1120 is disposed within the semiconductor chip body 1110, and includes, for example, a data storing unit (not shown) for storing data and/or a data processing unit (not shown) for processing the data.

The bonding pads 1130 are disposed over the first surface 1111 of the semiconductor chip body 1110, and a plurality of the bonding pads 1130 are arranged along an edge of the first surface 1111. In the present embodiment, respective bonding pads 1130 are electrically connected with the circuit unit 1120. Signals applied from the outside are inputted into the circuit unit 1120 through the bonding pads 1130. Similarly signals generated from the circuit unit 1120 are outputted to external equipment through the bonding pads 1130. In the present embodiment, respective bonding pads 1130 include an opening 1132.

The through electrode unit 1210 includes a plurality of conductive polarization particles 1212 that are electrically connected. The conductive polarization particles 1212 include conductive rheological material having a first polarity and a second polarity opposite the first polarity. In the present embodiment, the first polarity is, for example, (+) polarity and the second polarity is, for example, (−) polarity. In the plurality of the conductive polarization particles 1212, opposite polarities are electrically connected to each other. For example, in a plurality of conductive polarization particles having the first polarity is a (+) polarity and the second polarity is a (−) polarity, the (+) polarity of a conductive polarization particle will face the (−) polarity of a neighboring particle as shown in FIG. 19.

The insulation unit 1220 insulates the through electrode unit 1210 formed of the plurality of the conductive polarization particles 1212 from an inner surface of the semiconductor chip body 1110 defined by the through hole 1140. The insulation unit 1220 not only insulates the through electrode unit 1210 but also prevents external force and/or vibration from disconnecting the electrically connected conductive polarization particles 1212.

The through electrode unit 1210 contains the conductive polarization particles 1212 and is electrically connected to the bonding pad 1130.

In the present embodiment, the through electrode unit 1210 and the insulation unit 1220 are disposed, for example, within the through hole 1140.

Figure 20:
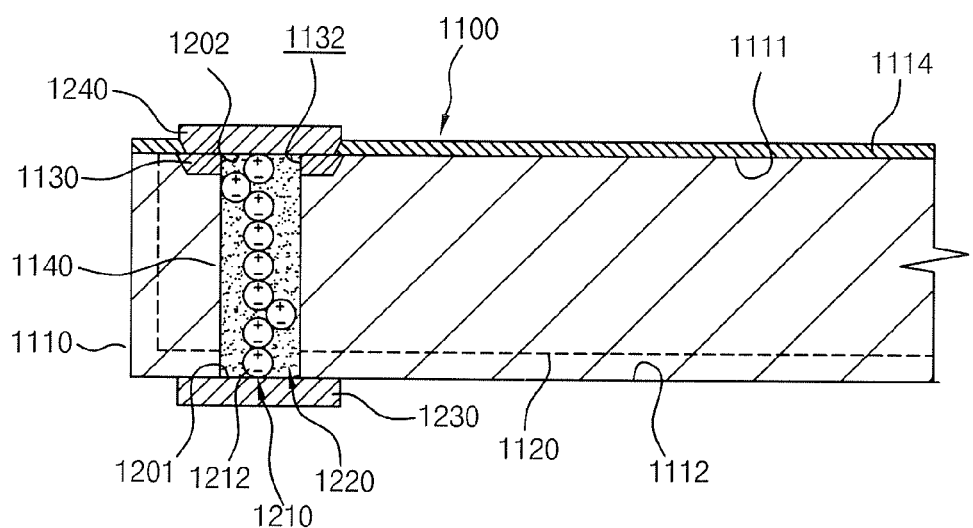
FIG. 20 is a cross-sectional view showing a semiconductor package in accordance with another embodiment of the present invention.

FIG. 20 is a cross-sectional view showing a semiconductor package in accordance with another embodiment of the present invention, which has substantially the same configuration as the semiconductor package shown in FIG. 19, except for a conductive connection member. Therefore, descriptions of the same components will be omitted and the same names and reference numerals will be given to the same components.

Referring to FIG. 20, the semiconductor package 1300 includes the semiconductor chip 1100, having the semiconductor chip body 1110, the circuit unit 1120, the bonding pad 1130, the through hole 1140, the through electrode unit 1210, the insulation unit 1220, and the conductive connection members 1230 and 1240.

The conductive connection members 1230 and 1240 are disposed at least one end of the first end 1201 and the second end 1202 of the through electrode unit 1210 disposed within the through hole 1140. In the present embodiment, the first end 1201 of the through electrode unit 1210 is disposed over the first surface 1111 of the semiconductor chip body 1110 and the second end 1202 of the through electrode unit 1210 is disposed over the second surface 1112 of the semiconductor chip body 1110.

In the present embodiment, the conductive connection members 1230 and 1240 are respectively disposed over the first end 1201 and the second end 1202 of the through electrode unit 1210, and the through electrode unit 1210 is electrically connected to the conductive connection members 1230 and 1240.

The conductive connection members 1230 and 1240 may have a plate shape and may be formed of an anisotropic conductive film (ACF) containing resin and conductive particles arranged within the resin. Alternatively, the conductive connection members 1230 and 1240 may be formed of a metal layer having a plate shape. In the present embodiment, the metal layer may include a low melting point metal, such as a solder. The conductive connection members 1230 and 1240 are particularly useful when manufacturing a stacked semiconductor package in which at least two semiconductor packages are stacked.

Figure 21:
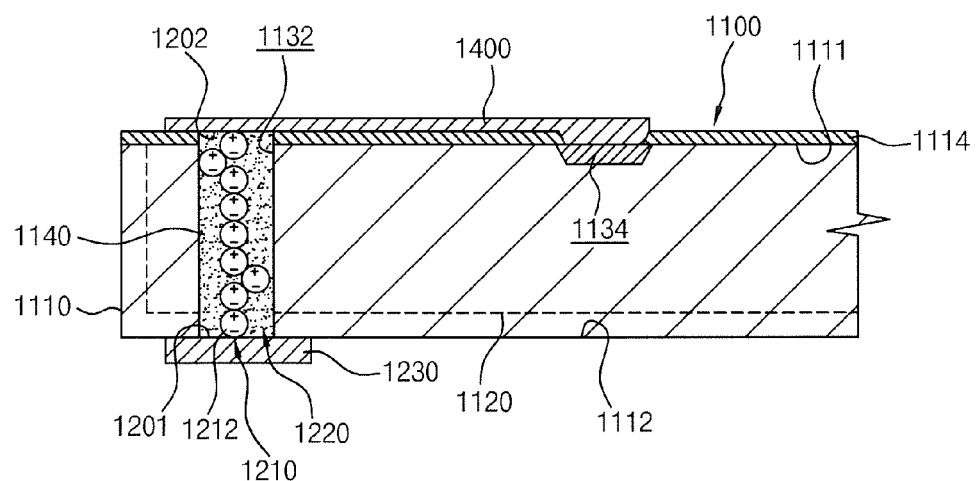
FIG. 21 is a cross-sectional view showing a semiconductor package in accordance with another embodiment of the present invention.

FIG. 21 is a cross-sectional view showing a semiconductor package in accordance with another embodiment of the present invention, which has substantially the same configuration as the semiconductor package shown in FIG. 19, except for the wiring unit and the positioning of the bonding pads. Therefore, descriptions of the same components will be omitted and the same names and reference numerals will be given to the same components.

Referring to FIG. 21, the semiconductor package 1300 includes the semiconductor chip 1100 having the semiconductor chip body 1110, the circuit unit 1120, the bonding pad 1134, the through holes 1140, the through electrode unit 1210, the insulation unit 1220, and wiring units 1400.

In the present embodiment, the bonding pads 1134 are arranged in one or two rows in central portion of the first surface 1111 of the semiconductor chip body 1110. In the present embodiment, the bonding pads 1134 are arranged, for example, in a single row over the first surface 1111 of the semiconductor chip body 1110.

When the bonding pads 1134 are disposed in the central portion of the first surface 1111 of the semiconductor chip body 1110, the bonding pads 1134 are separated by a predetermined space from the through electrode unit 1210 and the insulation unit 1220, which are disposed at an edge of the semiconductor chip body 1110.

As shown in FIG. 21, the wiring units 1400 are disposed over the first surface 1111 of the semiconductor chip body 1110. The wiring units 1400 electrically connect the bonding pad 1134 and the through electrode unit 1210 corresponding to the bonding pad 1134, respectively. In the present embodiment, the wiring unit 1400 may include a conductive material having excellent electrical properties, such as copper, and the wiring unit 1400 may have a linear shape when viewed from the top.

Figure 22:
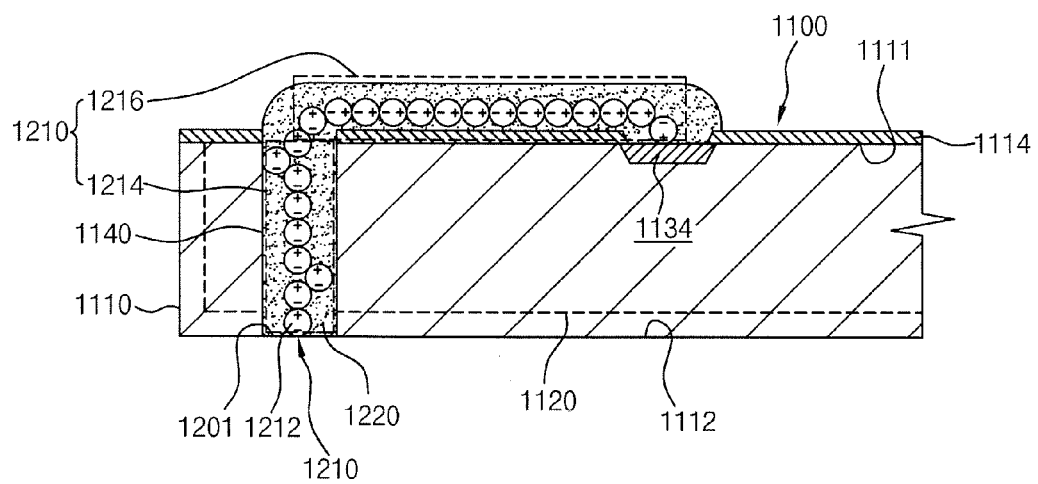
FIG. 22 is a cross-sectional view showing a semiconductor package in accordance with another embodiment of the present invention.

FIG. 22 is a cross-sectional view showing a semiconductor package in accordance with another embodiment of the present invention, which has substantially the same configuration as the semiconductor package shown in FIG. 19, except for the through electrode unit and the positioning of the bonding pads. Therefore, descriptions of the same components will be omitted and the same names and reference numerals will be given to the same components.

Referring to FIG. 22, the semiconductor package 1300 includes the semiconductor chip 1100 having the semiconductor chip body 1110, the circuit unit 1120, the bonding pad 1134, the through holes 1140, the through electrode unit 1210, and the insulation unit 1220.

The bonding pads 1134 are arranged in a central portion of the first surface 1111 of the semiconductor chip body 1110. Respective pads 1134 are electrically connected to the circuit unit 1120.

The through electrode unit 1210 includes a through unit 1214 and an extension unit 1216. The through unit 1214 is disposed within the through hole 1140, and the extension unit 1216 extends from the through unit 1214 along the first surface 1111 of the semiconductor chip 1100 and is electrically connected with respective bonding pads 1134.

The through unit 1214 and the extension unit 1216 of the through electrode unit 1210 are formed integrally with each other, and the through unit 1214 and the extension unit 1216 each contain conductive polarization particles 1212 having a first polarity and a second polarity. Adjacent conductive polarization particles 1212 are electrically connected to each other by opposite polarities in contact with each other. For example, in a plurality of conductive polarization particles having the first polarity is a (+) polarity and the second polarity is a (−) polarity, the (+) polarity of a conductive polarization particle will be in contact with the (−) polarity of a neighboring particle as shown in FIG. 22.

Figure 23:
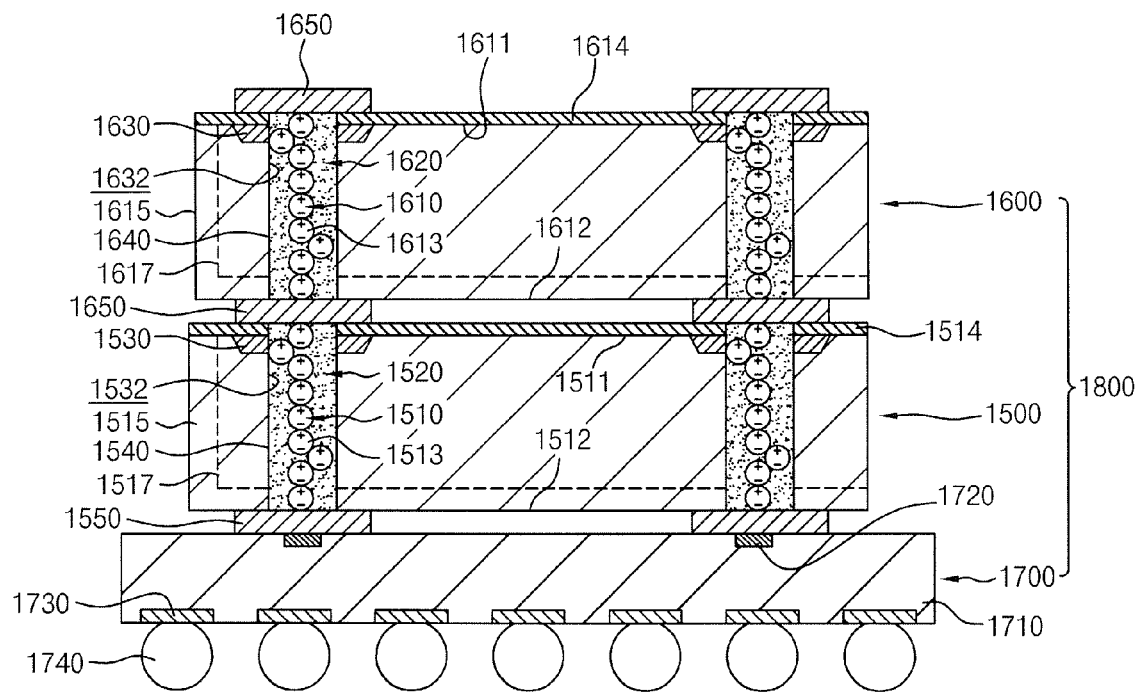
FIG. 23 is a cross-sectional view showing a semiconductor package in accordance with another embodiment of the present invention.

FIG. 23 is a cross-sectional view showing a semiconductor package in accordance with another embodiment of the present invention.

Referring to FIG. 23, the semiconductor package 1800 includes a first semiconductor chip 1500, a second semiconductor chip 1600, and a substrate 1700.

In the present embodiment, the first semiconductor chip 1500 is disposed over the substrate 1700 and the second semiconductor chip 1600 is disposed over the first semiconductor chip 1500.

The first semiconductor chip 1500 includes a first semiconductor chip body 1515, a first circuit 1517, first bonding pads 1530, first through holes 1540, a first through electrode unit 1510, and a first insulation unit 1520.

The first semiconductor chip body 1515 may have, for example, a rectangular parallelepiped shape, and includes a first surface 1511 and a second surface 1512 opposite the first surface 1511. In the present embodiment, a protective layer 1514, which exposes the first bonding pads 1530 and the first through holes 1540, is disposed over the first surface 1511 of the first semiconductor chip body 1515.

The first circuit unit 1517 is disposed within the first semiconductor chip body 1515, and includes, for example, a data storing unit (not shown) for storing data and a data processing unit (not shown) for processing the data.

The first bonding pads 1530 are disposed over the first surface 1511 of the first semiconductor chip body 1515, and a plurality of the first bonding pads 1530 are arranged along the edge of the first surface 1511. In the present embodiment, the first bonding pads 1530 are electrically connected to the first circuit unit 1517. Signals applied from the outside are inputted into the first circuit unit 1517 through the first bonding pads 1530 and signals generated from the first circuit unit 1517 are outputted to external equipment by the first bonding pads 1530. In the present embodiment, respective first bonding pads 1530 include a first opening 1532.

The first through holes 1540 pass through both the first surface 1511 and the second surface 1512 of the first semiconductor chip body 1515. In the present embodiment, the respective first through holes 1540 are disposed at a position corresponding to the first opening 1532 of the first bonding pad 1530.

The first through electrode unit 1510 includes conductive polarization particles 1513 that are electrically connected in plural. The conductive polarization particles 1513 include conductive rheological material having a first polarity and a second polarity opposite the first polarity. In the present embodiment, the first polarity is, for example, (+) polarity and the second polarity is, for example, (−) polarity. In the plurality of the conductive polarization particles 1513, opposite polarities are electrically connected to each other. For example, in a plurality of conductive polarization particles having the first polarity is a (+) polarity and the second polarity is a (−) polarity, the (+) polarity of a conductive polarization particle will be in contact with the (−) polarity of a neighboring particle as shown in FIG. 23.

The first insulation unit 1520 insulates the first through electrode unit 1510, which is formed of the plurality of the conductive polarization particles 1513, from an inner surface of the first semiconductor chip body 1515, which is defined by the first through hole 1540. The first insulation unit 1520 also prevents the electrically connected conductive polarization particles 1513 from being disconnected by external force and/or vibration.

The first through electrode unit 1510 containing the conductive polarization particles 1513 is electrically connected to the first bonding pad 1530.

In the present embodiment, the first through electrode unit 1510 and the first insulation unit 1520 are disposed, for example, within the first through hole 1540.

The second semiconductor chip 1600 disposed over the first semiconductor chip 1500 includes a second semiconductor chip body 1615, a second circuit 1617, second bonding pads 1630, second through holes 1640, a second through electrode unit 1610, and a second insulation unit 1620.

The second semiconductor chip body 1615 may have, for example, a rectangular parallelepiped shape, and may include a third surface 1611 and a fourth surface 1612 opposite the third surface 1611. In the present embodiment, the first surface 1511 of the first semiconductor chip body 1515 faces the fourth surface 1612 of the second semiconductor chip body 1615. In the present embodiment, a protective layer 1614, which exposes the second bonding pads 1630 and the second through holes 1640, is disposed over the third surface 1611 of the second semiconductor chip body 1615.

The second circuit unit 1617 is disposed within the second semiconductor chip body 1615, and includes, for example, a data storing unit (not shown) for storing data and a data processing unit (not shown) for processing the data.

The second bonding pads 1630 are disposed over the third surface 1611 of the second semiconductor chip body 1615, and a plurality of the second bonding pads 1630 are arranged along the edge of the second surface 1611. In the present embodiment, the second bonding pads 1630 are electrically connected to the second circuit unit 1617. Signals applied from the outside are inputted into the second circuit unit 1617 by the second bonding pads 1630 and signals generated from the second circuit unit 1617 are outputted to external equipment by the second bonding pads 1630. In the present embodiment, the respective second bonding pads 1630 include a second opening 1632.

The second through holes 1640 pass through both the third surface 1611 and the fourth surface 1612 of the second semiconductor chip body 1615. In the present embodiment, the respective second through holes 1640 are disposed at a position corresponding to the second opening 1632 of the second bonding pad 1630.

The second through electrode unit 1610 includes conductive polarization particles 1612 that are electrically connected in plural. The conductive polarization particles 1613 include conductive rheological material having a first polarity and a second polarity which is opposite the first polarity. In the present embodiment, the first polarity is, for example, (+) polarity and the second polarity is, for example, (−) polarity. In the plurality of the conductive polarization particles 1612, opposite polarities are electrically connected to each other as discussed above with reference to the first semiconductor chip 1500.

The second insulation unit 1620 insulates the second through electrode unit 1610, which is formed of the plurality of the conductive polarization particles 1613, from an inner surface of the second semiconductor chip body 1615, which is defined by the second through hole 1640. The second insulation unit 1620 also prevents the electrically connected conductive polarization particles 1613 from being disconnected by external force and/or vibration.

The second through electrode unit 1610 containing the conductive polarization particles 1613 is electrically connected to the second bonding pad 1630.

In the present embodiment, the second through electrode unit 1610 and the second insulation unit 1620 are disposed, for example, within the second through hole 1640.

Meanwhile, conductive connection members 1550 and 1650 may be disposed respectively at the ends of the first through electrode unit 1510 of the first semiconductor chip 1500 and the second through electrode unit 1610 of the second semiconductor chip 1600, such that the first semiconductor chip 1500 and the second semiconductor chip 1600 are electrically connected to each other by the conductive connection members 1550 and 1650.

The substrate 1700 includes a substrate body 1710, connection pads 1720, ball land patterns 1730, and conductive balls 1740.

The substrate body 1710 may be, for example, a printed circuit board having a plate shape.

The connection pads 1720 are disposed over the upper surface of the substrate body 1710, which faces the second surface 1512 of the first semiconductor chip 1500. The connection pad 1720 is electrically connected to the through electrode 1510 of the first semiconductor chip 1500. The through electrode 1510 of the first semiconductor chip 1500 is electrically connected to the connection pad 1720 by the conductive connection member 1550.

The ball land pattern 1730 is disposed over the lower surface opposite the upper surface of the substrate body 1710, and the ball land pattern 1730 is electrically connected to the connection pad 1720 through a conductive via, or the like.

The conductive balls 1740 are disposed over the ball land patterns 1730, and the conductive balls 1740 may include a metal having a low melting temperature, such as a solder.

As is apparent from the above description, in the present invention, the terminals of the circuit substrate are connected by a wiring unit, which includes conductive polarization particles, and an insulation unit that insulates the wiring unit. Similarly, a land pattern and a bonding pad of the semiconductor chip are electrically connected by a wiring unit, which includes conductive polarization particles, and an insulation unit that insulates the wiring unit. Therefore, it is possible to simplify the circuit wire forming process, facilitate fault detection of the circuit wire, and form the circuit wire that intersects another circuit wire in the same plane without shorting the intersecting circuit wires.

Also, it is possible to form an electrode with no void that passes through the semiconductor chip in the semiconductor package.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A circuit substrate, comprising:
   a substrate body;
   a first terminal disposed over the substrate body;
   a second terminal disposed over the substrate body and separated from the first terminal; and
   a circuit wire comprising:
      a wiring unit for electrically connecting the first and second terminals by electrically connecting a plurality of conductive polarization particles, wherein each conductive polarization particle of the plurality of conductive polarization particles has a first polarity and a second polarity that is opposite to the first polarity; and
      an insulation unit for insulating the wiring unit.

2. The circuit substrate according to claim 1, wherein the plurality of conductive polarization particles are comprised of a conductive rheological material.

3. The circuit substrate according to claim 1, further comprising:
   a third terminal disposed over the substrate body;
   a fourth terminal disposed over the substrate body and separated from the third terminal; and
   an intersection wire comprising an intersection wiring unit and an intersection insulation unit for insulating the intersection wiring unit, the intersection wiring unit comprising:
      a plurality of conductive polarization particles for electrically connecting the third and fourth terminals,
   wherein the intersection wire intersects the circuit wire over the substrate body.

4. The circuit substrate according to claim 1, further comprising:
   a third terminal disposed over the substrate body;
   a metal wire disposed over the substrate body;
   an additional circuit wire comprising an additional wiring unit and an additional insulation unit for insulating the additional wiring unit, the additional wiring unit comprising:
      a plurality of conductive polarization particles for electrically connecting the metal wire and the third terminal.

5. The circuit substrate according to claim 1, further comprising:
   a first connection unit extending from the first terminal along the substrate body; and
   a second connection unit extending from the second terminal along the substrate body,
   wherein a first end of the wiring unit is connected to the first connection unit and a second end of the wiring unit, opposite the first end, is connected to the second connection unit.

6. A method of manufacturing a circuit substrate, comprising the steps of:
   forming a first terminal on a surface of a substrate body;
   forming a second terminal on the surface of the substrate body;
   forming a preliminary circuit wire by connecting the first and second terminals with a wiring material, the wiring material comprising:
      a plurality of conductive polarization particles having a first polarity and a second polarity that is opposite the first polarity; and
      a flowable insulator;
   forming a wiring unit electrically connected to the first and second terminals by applying a first power having the first polarity to the first terminal and a second power having the second polarity to the second terminal and thus electrically connecting the conductive polarization particles within the flowable insulator; and
   forming an insulation unit for securing and insulating the wiring unit by curing the flowable insulator.

7. The method according to claim 6, wherein the conductive polarization particles are formed of conductive rheological material.

8. The method according to claim 6, wherein the step of forming the preliminary circuit wire is carried out by one of a printing process, a dispensing process; and a silk screen printing process.

9. The method according to claim 6, wherein the step of forming the substrate body comprises the step of:
   forming a first connection unit extending from the first terminal along the substrate body and a second connection unit extending from the second terminal along the substrate body,
   wherein a first end of the wiring unit is connected to the first connection unit and a second end that is opposite the first end is connected to the second connection unit.

10. A semiconductor package, comprising:
a semiconductor chip;
a plurality of bonding pads formed over an upper surface of the semiconductor chip;
a plurality of conductive land patterns separated from the plurality of bonding pads; and
a plurality of circuit wires, each circuit wire comprising:
a wiring unit for electrically connecting a bonding pad of the plurality of bonding pads and a conductive land pattern of the plurality of land patterns corresponding to the bonding pad by electrically connecting a plurality of conductive polarization particles respectively having a first polarity and a second polarity that is opposite to the first polarity; and
an insulation unit for insulating the wiring unit.

11. The semiconductor package according to claim 10, wherein the plurality of conductive polarization particles are comprised of a conductive rheological material.

12. The semiconductor package according to claim 10, wherein the plurality of land patterns are comprised of an anisotropic conductive film.

13. The semiconductor package according to claim 10, wherein the plurality of land patterns are comprised of a metal plate.

14. The semiconductor package according to claim 10, wherein the plurality of land patterns comprise a connection unit extending along the upper surface of the semiconductor chip, and an end of the circuit wire is electrically connected to the connection unit.

15. The semiconductor package according to claim 10, wherein at least two circuit wires of the plurality of circuit wires intersect each other.

16. The semiconductor package according to claim 10, further comprising:
a solder resist pattern disposed over the upper surface of the semiconductor chip and having openings for exposing both the plurality of land patterns and connection members respectively connected to the plurality of land patterns through the openings.

17. The semiconductor package according to claim 16, wherein the connection member comprise a conductive ball.

18. The semiconductor package according to claim 10, wherein the land patterns are disposed over a surface of the semiconductor chip.

19. The semiconductor package according to claim 10, further comprising:
a molding member for covering a lower surface of the semiconductor chip, that is opposite to the upper surface of the semiconductor chip, and side surfaces of the semiconductor chip connected with the upper surface of the semiconductor chip.

20. The semiconductor package according to claim 19, wherein one or more of the land patterns of the plurality of land patterns are disposed over the semiconductor chip and the remaining land patterns of the plurality of land patterns are disposed over the molding member.

21. The semiconductor package according to claim 10, further comprising:
a substrate;
a plurality of connection pads disposed on the substrate at positions corresponding to the plurality of land patterns; and
bumps for electrically connecting the plurality of connection pads and the plurality of land patterns.

22. The semiconductor package according to claim 21, further comprising:
a gap filling member filled in a gap formed between the semiconductor chip and the substrate.

23. A semiconductor package, comprising:
a substrate having connection pads formed thereon;
a semiconductor chip module comprising a plurality of semiconductor chips having pads formed thereon; and
a plurality of circuit wires, each circuit wire comprising:
a wiring unit for electrically connecting a pad of respective semiconductor chips and a connection pad corresponding to the pad by electrically connecting a plurality of conductive polarization particles having a first polarity and a second polarity opposite to the first polarity; and
an insulation unit for covering the wiring unit.

24. The semiconductor package according to claim 23, wherein the semiconductor chips are stacked in a stepped shape to expose the pads of the respective semiconductor chips.

25. The semiconductor package according to claim 23, wherein the plurality of conductive polarization particles are comprised of a conductive rheological material.

26. The semiconductor package according to claim 23, further comprising:
a guide member disposed at a side surface of respective semiconductor chips forming an inclined plane having an obtuse angle with respect to an upper surface of the respective semiconductor chip.

27. A semiconductor package, comprising:
a substrate having connection pads formed thereon;
a semiconductor chip module comprising a plurality of semiconductor chips respectively having exposed chip selection pads; and
a plurality of circuit wires, each circuit wire comprising:
a wiring unit for electrically connecting a chip selection pad of respective semiconductor chips and a connection pad corresponding to the chip selection pad by electrically connecting a plurality of conductive polarization particles having a first polarity and a second polarity opposite the first polarity; and
an insulation unit for covering the wiring unit.

28. The semiconductor package according to claim 27, wherein the plurality of semiconductor chips are stacked in a stepped shape to expose the chip selection pads formed in the respective semiconductor chips.

29. The semiconductor package according to claim 27, wherein the plurality of conductive polarization particles are comprised of a conductive rheological material.

30. The semiconductor package according to claim 27, further comprising:
a guide member disposed at a side surface of respective semiconductor chips forming an inclined plane having an obtuse angle with respect to an upper surface of the respective semiconductor chip.

31. The semiconductor package according to claim 27, wherein the semiconductor chip further comprises:
a data pad;
a data redistributions electrically connected to the data pad; and
a data through electrode passing through the semiconductor chip and electrically connected to the data redistribution.

32. The semiconductor package according to claim 27, wherein the chip selection pads of the semiconductor chips are electrically connected to one connection pad by circuit wires that intersect each other.

33. A semiconductor package, comprising:
a semiconductor chip comprising:
  a circuit unit;
  a bonding pad electrically connected to the circuit unit; and
  a through hole electrically connected to the circuit unit;
a through electrode unit disposed within the through hole and electrically connected to the bonding pad, the through unit comprising a plurality of conductive polarization particles having a first polarity and a second polarity opposite the first polarity and electrically connected to each other; and
insulation units for insulating the through electrodes.

34. The semiconductor package according to claim 33, wherein the plurality of conductive polarization particles are comprised of a conductive rheological material.

35. The semiconductor package according to claim 33, wherein the bonding pad is disposed at a position corresponding to the through hole.

36. The semiconductor package according to claim 35, wherein the bonding pad is disposed over an edge of the upper surface of the semiconductor chip.

37. The semiconductor package according to claim 35, further comprising:
  a conductive connection member for partially covering or completely covering at least one end of the through electrode unit.

38. The semiconductor package according to claim 37, wherein the conductive connection member comprises an anisotropic conductive film having resin and conductive particles arranged within the resin.

39. The semiconductor package according to claim 37, wherein the conductive connection member comprises a conductive layer.

40. The semiconductor package according to claim 39, wherein the conductive layer comprises a solder.

41. The semiconductor package according to claim 33, wherein the through hole and a bonding pad corresponding to the through hole are separated from each other by a given distance.

42. The semiconductor package according to claim 33, further comprising:
  a wiring unit for electrically connecting the through electrode unit and a bonding pad corresponding to the through electrode unit.

43. The semiconductor package according to claim 33, wherein two or more semiconductor chips are stacked.

* * * * *